(12) United States Patent
Yamazaki et al.

(10) Patent No.: US 7,405,033 B2
(45) Date of Patent: Jul. 29, 2008

(54) METHOD FOR MANUFACTURING RESIST PATTERN AND METHOD FOR MANUFACTURING SEMICONDUCTOR DEVICE

(75) Inventors: Shunpei Yamazaki, Tokyo (JP); Yasuyuki Arai, Atsugi (JP); Yasuko Watanabe, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 610 days.

(21) Appl. No.: 10/757,193

(22) Filed: Jan. 14, 2004

(65) Prior Publication Data

US 2004/0147066 A1 Jul. 29, 2004

(30) Foreign Application Priority Data

Jan. 17, 2003 (JP) ............................. 2003-009111

(51) Int. Cl.
*G03F 7/20* (2006.01)
*G03F 7/26* (2006.01)
*G03F 7/16* (2006.01)

(52) U.S. Cl. ..................... 430/311; 430/394; 430/322

(58) Field of Classification Search ................. 430/311, 430/394
See application file for complete search history.

(56) References Cited

U.S. PATENT DOCUMENTS

| | | | | |
|---|---|---|---|---|
| 5,132,248 | A | 7/1992 | Drummond et al. | 437/173 |
| 5,380,670 | A * | 1/1995 | Hagino | 438/138 |
| 6,294,401 | B1 | 9/2001 | Jacobson et al. | 438/99 |
| 6,362,507 | B1 | 3/2002 | Ogawa et al. | 257/350 |
| 6,514,801 | B1 | 2/2003 | Yudasaka et al. | 438/151 |
| 6,713,389 | B2 * | 3/2004 | Speakman | 438/674 |
| 6,794,220 | B2 | 9/2004 | Hirai et al. | 438/99 |
| 2002/0070382 | A1 | 6/2002 | Yamazaki et al. | |
| 2002/0197565 | A1 * | 12/2002 | Wu | 430/311 |
| 2003/0054653 | A1 | 3/2003 | Yamazaki et al. | 438/694 |
| 2003/0059987 | A1 | 3/2003 | Sirringhaus et al. | 438/149 |
| 2003/0202132 | A1 * | 10/2003 | Park | 349/43 |
| 2004/0121264 | A1 * | 6/2004 | Liegl et al. | 430/311 |
| 2004/0134420 | A1 * | 7/2004 | Lei | 118/50 |
| 2004/0147066 | A1 | 7/2004 | Yamazaki et al. | |
| 2004/0147113 | A1 | 7/2004 | Yamazaki et al. | 438/660 |
| 2004/0253835 | A1 | 12/2004 | Kawase | 438/780 |
| 2005/0032378 | A1 * | 2/2005 | Yu et al. | 435/689 |

(Continued)

FOREIGN PATENT DOCUMENTS

JP 05-338187 12/1993

(Continued)

*Primary Examiner*—Mark F. Huff
*Assistant Examiner*—Brittany Raymond
(74) *Attorney, Agent, or Firm*—Cook, Alex, McFarron, Manzo, Cummings & Mehler, Ltd.

(57) ABSTRACT

To provide a method for manufacturing a resist pattern designed to reduce a manufacturing cost by improving efficiency in the use of a resist material, a method for removing a resist pattern, and a method for manufacturing a semiconductor device.

The present invention includes a step of forming a resist pattern by discharging a composition containing photosensitizer on a object to be processed under reduced pressure. The present invention includes a step of etching the object to be processed using the resist pattern as a mask, a step of irradiating the resist pattern through a photomask with light within a photosensitive wavelength region of a photosensitizer, and a step of removing the resist pattern on the object to be processed.

22 Claims, 16 Drawing Sheets

U.S. PATENT DOCUMENTS

2005/0197031 A1    9/2005  Yamazaki et al.
2005/0237350 A1*  10/2005  Aoki .............................. 347/9
2006/0007271 A1*   1/2006  Bibl et al. ..................... 347/65
2006/0263722 A1*  11/2006  Yamaguchi et al. ...... 430/270.1

FOREIGN PATENT DOCUMENTS

| | | |
|---|---|---|
| JP | 06-182980 | 7/1994 |
| JP | 06-237063 | 8/1994 |
| JP | 10-270843 | 10/1998 |
| JP | 2002-324966 | 11/2002 |
| JP | 2002-359246 | 12/2002 |

* cited by examiner

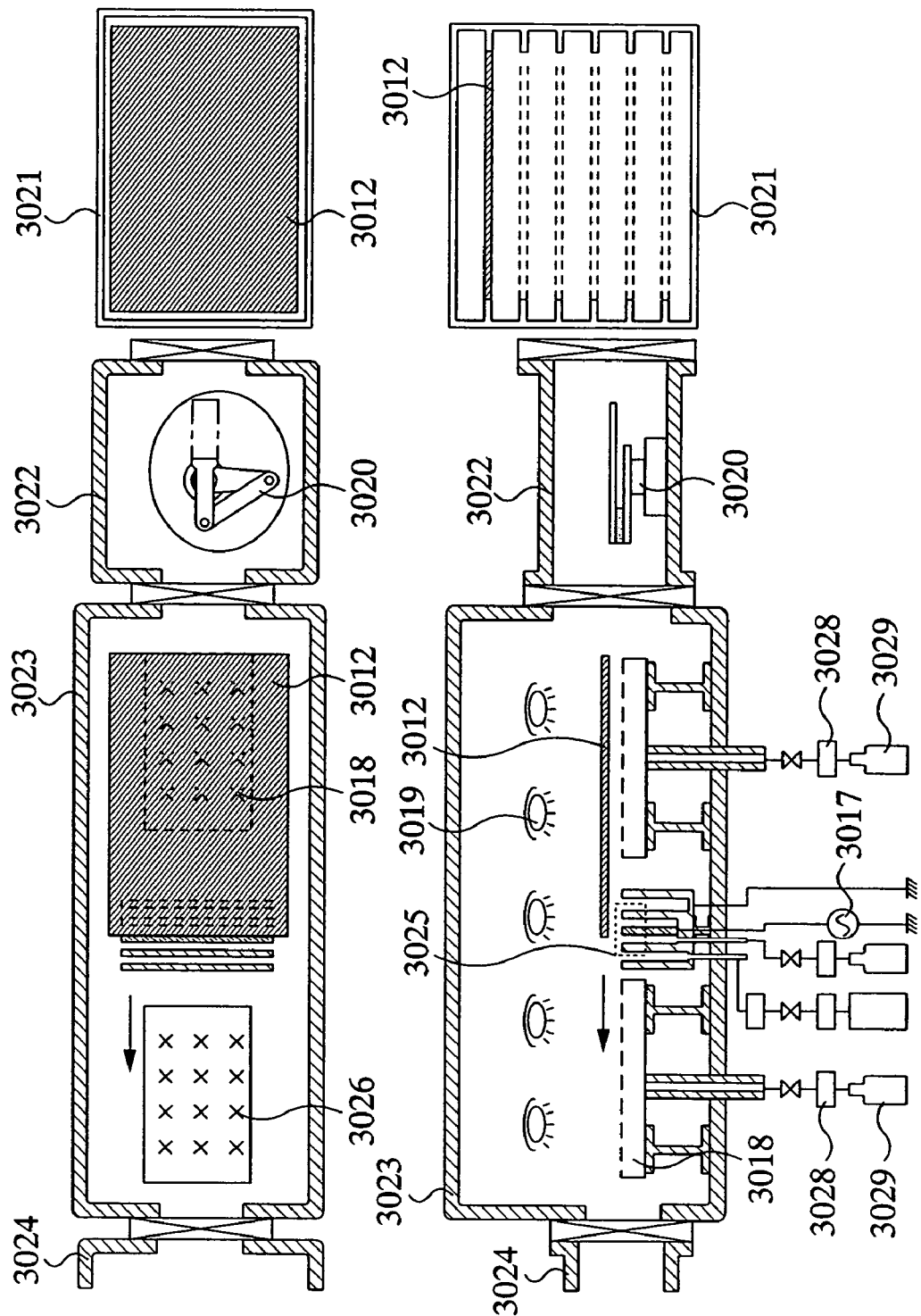

METHOD FOR MANUFACTURING RESIST PATTERN AND METHOD FOR MANUFACTURING SEMICONDUCTOR DEVICE

BACKGROUND OF THE INVENTION

1. Field of the Invention

The present invention relates to a method for manufacturing a resist pattern, more particularly, the invention relates to a method for manufacturing a resist pattern by using ink jetting, a method for removing the resist pattern, and a method for manufacturing a semiconductor device.

Further, the invention relates to a method for manufacturing a resist pattern by using a method for discharging a composition, a method for removing the resist pattern, and a method for manufacturing a semiconductor device.

2. Description of the Related Art

A thin film transistor (hereinafter referred to as a TFT) formed by using a thin film on an insulating surface is widely applied to an integrated circuit and the like, and is often used as a switching element. A display panel using the TFT has been widely used for a portable terminal and a large sized display device, therefore, high definition, high aperture ratio, high reliability and a large sized screen is increasingly required.

In the case of manufacturing such the thin film transistor, the technique of lithography in which a coating film of a photosensitive resin (photoresist) is formed on a substrate and exposed and developed with the use of a patterned mask and ultraviolet rays is used. A resist pattern formed with the technique is used as a mask in dry etching and wet etching. (Reference 1. Japanese Unexamined Patent Publication No. 2002-359246)

SUMMARY OF THE INVENTION

A coating film of a resist is often formed by dripping a liquid resist and by using a spin coater that makes a substrate spin to form the coating film using centrifugal force. In such a case, approximately 95% of a resist dripped during spin coating is scattered. A resist material, rotational speed of the spin coater, and way of spinning have been attempted to be devised, nevertheless approximately 90% of the resist is wasted. These problems become more serious when the coating film of the resist is formed over a large sized substrate.

When the spin coating is conducted, the substrate is coated with the resist as far as an edge portion of its periphery. Then, a resist at the edge portion is scraped in handling of the substrate, the scraped resist attaches to the substrate, and consequently a pattern defect is caused. Therefore, a step of edge cleaning to remove the resist at the edge portion with an organic solvent or the like is required. In the case of forming the coating film of the resist by the spin coating, there is a resist material to be wasted, and the step of edge cleaning is added if necessary.

The present invention is offered in view of the above problems, and it is an object of the invention to provide a method for manufacturing a resist pattern designed to reduce a manufacturing cost by improving efficiency in the use of a resist material, a method for removing a resist pattern, and a method for manufacturing a semiconductor device.

In order to solve the problems of the related art, following steps are taken in the present invention.

According to the present invention, a resist pattern is manufactured on an object to be processed by discharging a composition containing a photosensitizer from an ink head.

According to the present invention, a resist pattern is formed on an object to be processed by discharging a composition including a photosensitizer, and an ashing treatment is performed to the resist pattern at atmospheric pressure. Further, according to the present invention, a resist pattern is formed on an object to be processed by discharging a composition including a photosensitizer from a ink head, the resist pattern irradiated with light within a photosensitive wavelength region of the photosensitizer using a photomask is developed with a developer, the object to be processed is etched using the resist pattern as a mask, and then, the resist pattern on the object to be processed is removed.

According to the invention, treatment is performed under reduced pressure. As used here in, the term "under reduced pressure" denotes the condition that is under the pressure which is lower than atmospheric pressure. And the pressure may be set at from $1 \times 10^2$ Pa to $2 \times 10^4$ Pa (preferably, from $5 \times 10^2$ Pa to $5 \times 10^3$ Pa), and further reduced pressure, it may be set at from 1 Pa to $5 \times 10^4$ Pa (preferably, from $1 \times 10^2$ Pa to $1 \times 10^3$ Pa) when the atmosphere is filled with nitrogen, rare gas, or other inert gas. By setting under reduced pressure, volume of a droplet is reduced with constantly volatilizing a solvent from the droplet until the droplet reaches a thin film over a substrate. Therefore, subsequent heat treatment can be carried out in a shorter time.

Ink jetting is a method of keeping a relative distance between a nozzle and the object to be processed, moving either the nozzle or the object to be processed, and then discharging a composition from the nozzle in order to form a thin film formed of the composition on the object to be processed. Therefore, the ink jetting here includes other methods such as a dispenser method.

The present invention of using ink jetting has an advantage of being excellent at uniformity of a film thickness and the like compared with a screen printing method in which the thin film (typically, a light-emitting layer) is formed by applying a solution, using a printing roll or a relief printing in which a pattern to be printed is printed, and then baking.

According to the present invention having the above-described structure, the resist pattern can be easily formed over the large sized substrate having a side of over one meter on a side. Since a step of the spin coating is not required in the present invention and a smaller amount of the wasted material is left, the efficiency in the use of a material can be enhanced and the manufacturing cost can be reduced.

According to the present invention in which the resist pattern is formed under reduced pressure, generation of dust added to the resist pattern and reforming of a surface in which the surface of the object to be processed is oxidized can be prevented.

BRIEF DESCRIPTION OF THE DRAWINGS

FIGS. 8A and 8B are a top view and a cross sectional view of a plasma processing apparatus;

DETAILED DESCRIPTION OF THE PREFERRED EMBODIMENTS

Embodiment Mode 1

Embodiment mode of the present invention is described in detail with reference to drawings. However, the present invention is not limited the following description. As is easily known to person skilled in the art, the mode and the detail of the invention can be variously changed without departing from the purpose and the range of the present invention. Therefore, the present invention is not interpreted while limiting to the following description of the embodiment mode. The same symbol is used to the one that indicates the same among the different drawings in the structure of the present invention described below.

A mode of embodiment modes according to the present invention is described in detail with reference to FIGS. 1A to 3C. According to the present invention, a substrate 101 is to be formed of various materials such as glass, quartz, a semiconductor, a plastic, a plastic film, metal, a glass epoxy resin, and ceramic. The present invention can be applied to all steps using a mask pattern made by a photoresist which is designed to form any patterns such as a wiring pattern and a contact hole formed over the substrate 101.

Figure 1A:
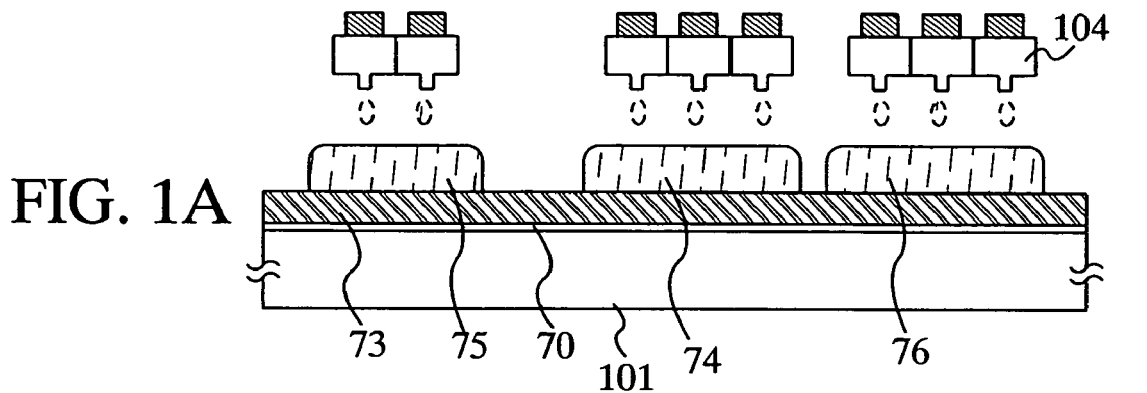
FIGS. 1A to 1E are cross sectional views explaining a manufacturing method of the present invention.
Figure 1B:
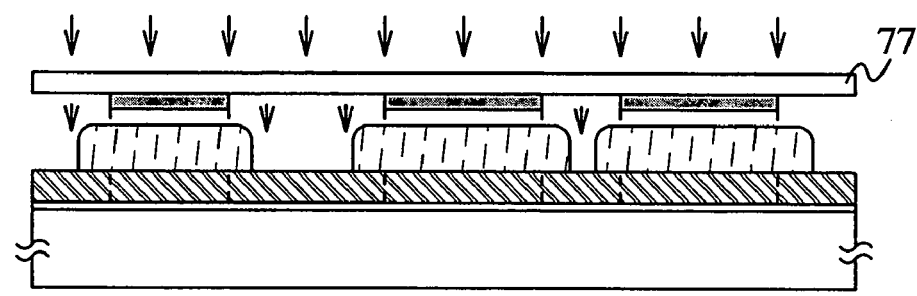
Figure 1C:
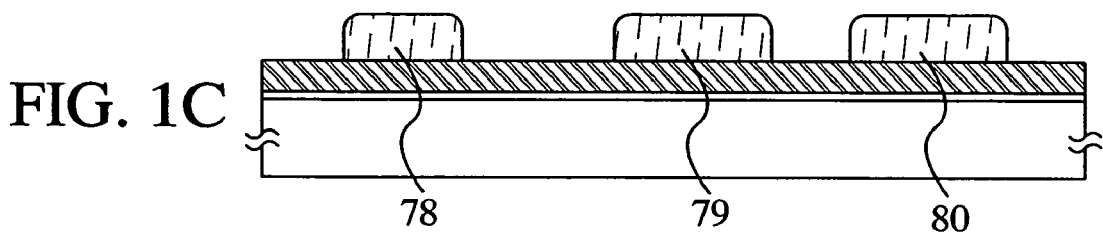
Figure 1D:
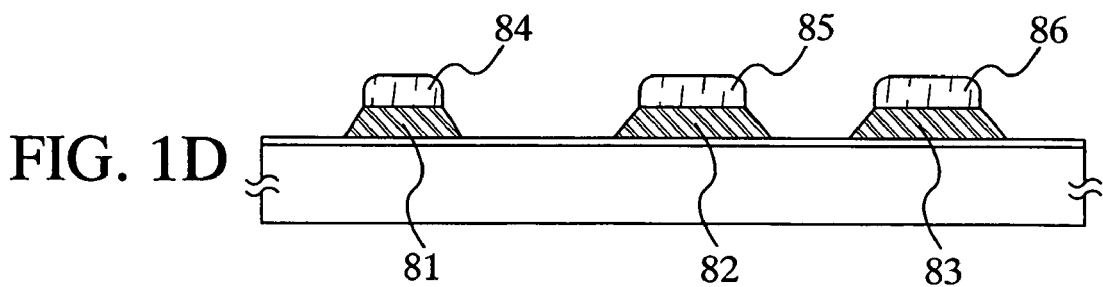
Figure 1E:
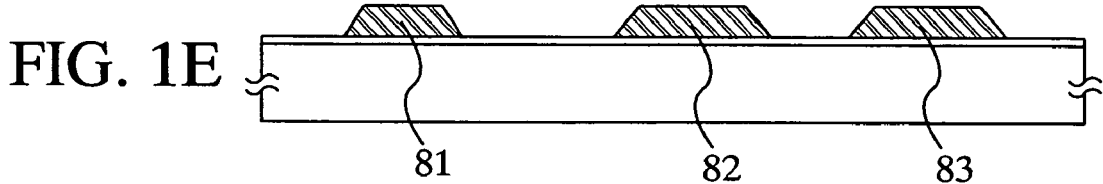

The present invention is characterized in that a resist is formed under reduced pressure by ink jetting, namely, by discharging a composition. A step of manufacturing a conductive layer using a method for manufacturing a resist pattern of the present invention is described with reference to FIGS. 1A to 1E and FIG. 2. As shown in FIG. 1A, a base film 70 comprising an insulating film is formed on the glass substrate 101, and thereafter a conductive film 73 is formed of a material including a conductive material by plasma CVD or sputtering so as to cover the substrate 101.

A photoresist (photosensitive resin) that is sensitive to ultraviolet rays is applied on the conductive film 73 under reduced pressure by the ink jetting, namely, by discharging a composition, so as to form resists 74, 75, and 76. According to the present invention in which the resist is formed by the ink jetting, a step of spin coating is not required, and efficiency in the use of a material can be widely enhanced. When the spin coating is employed, the resist is formed at an edge portion of a periphery of the substrate. According to the present invention, the resist can be formed only on a desired area, and a step of edge cleaning required when the step of the spin coating is conducted can be reduced.

Figure 2:
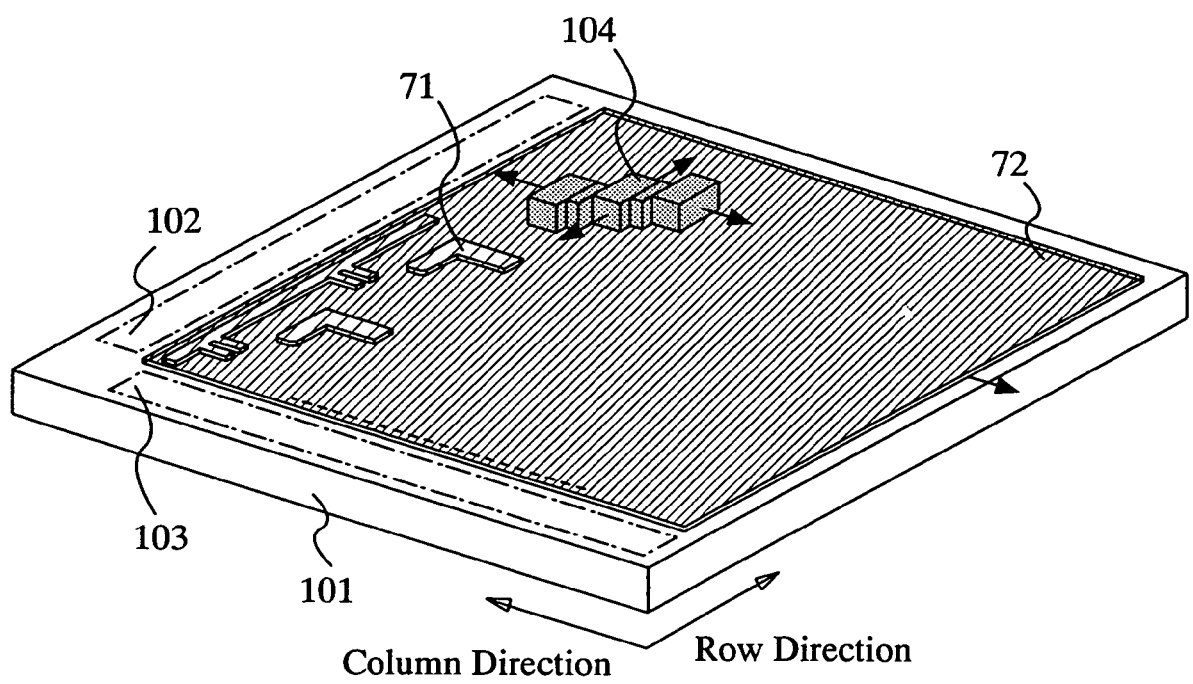
FIG. 2 is a perspective view explaining a manufacturing method of the present invention.

A perspective view of the present step is shown in FIG. 2. In FIG. 2, a reference numeral 101 denotes a substrate, 102 denotes a horizontal scanning driver circuit, 103 denotes a vertical scanning driver circuit, 104 denotes an ink head, 71 denotes a resist pattern, and 72 denotes a conductive film. The ink head 104 is scanned side to side and up and down while being parallel to the surface of the substrate 101, using one or plural ink head, thereby conducting the coating of the solution. According to this structure, the resist can be applied only to the desired area.

In FIG. 2, an ink head having three nozzles is shown, however, ink heads having only one nozzle respectively may be used by arranging in parallel. Further, plural ink heads having various nozzle diameters may be prepared and appropriately used according to usage. A normal nozzle diameter of the ink head is from 50 µm to 100 µm (in wider range, from 0.01 µm to 100 µm); depending on the nozzle diameter, plural nozzles may be arranged in parallel for having the same length as the side of the substrate so that the resist can be formed by scanning the ink head once in consideration of throughput. However, an optional number of nozzles may be arranged and plural scanning may be performed, or the same area may be scanned a number of times to be recoated. Further, the ink head 104 is preferably to be scanned, however, the substrate 101 may be moved instead. A distance between the substrate 101 and the ink head 104 is preferably set as closely as possible, in particular, approximately from 0.1 mm to 2 mm in order to drop into the desired area.

Figure 3A:
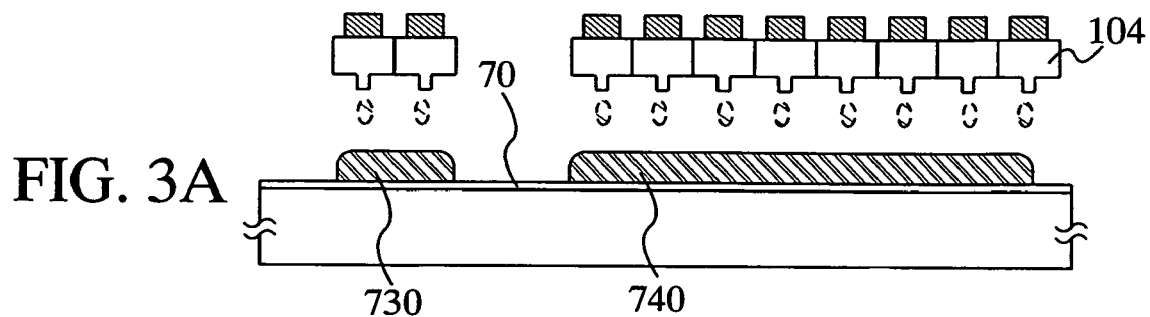
FIGS. 3A to 3D are cross sectional views explaining a manufacturing method of the present invention.
Figure 3B:
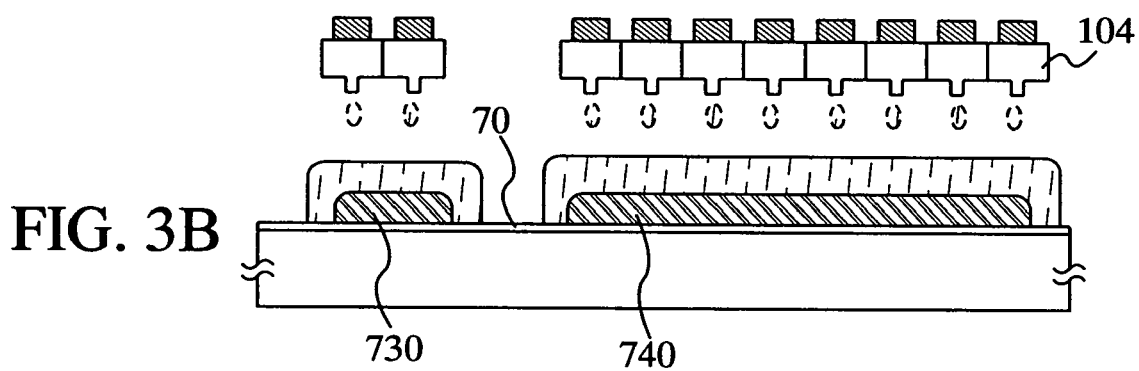
Figures 3C, 3D:
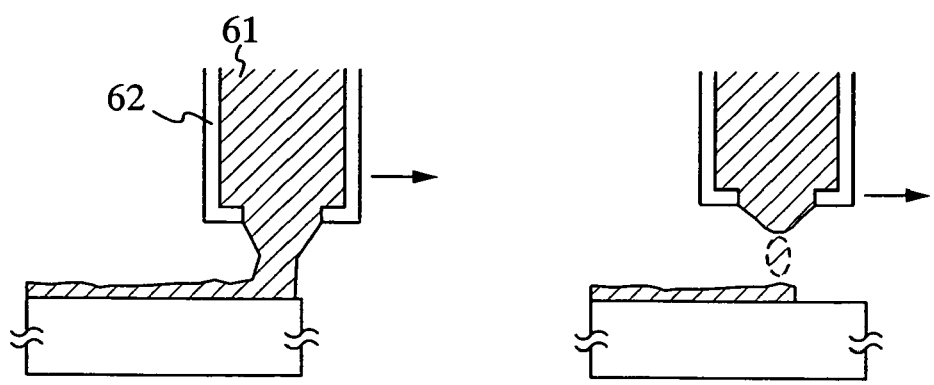

In FIGS. 3C and 3D, cross-sectional views of the ink head 104 are shown, and two methods for discharging a composition from the ink head 104 are also shown. A method for forming the resist by discharging the composition from the ink head 104 in sequence without stopping discharging is shown in FIG. 3C. A method for forming the resist by dropping the composition from the ink head 104, namely, by selectively dropping the composition is shown in FIG. 3D. Note that a reference numeral 61 denotes a composition, 62 denotes an ink head in FIGS. 3C and 3D. According to the present invention, either method for discharging the composition may be employed.

As for the composition discharged from the ink head, a composition containing a photosensitizer may be used. For instance, a composition made by dissolving or by dispersing a material into a solvent is used, wherein the material is a positive type resist such as a compound of a novolak resin and a naphthoquinone diazide which is photosensitizer, a negative type resist such as a compound of a base resin, diphenylsilanediol, and an acid-forming agent, or the like. As the solvent, ester such as butyl acetate, ethyl acetate, alcohol such as isopropyl alcohol, ethyl alcohol, or organic solvent such as methyl ethyl ketone, acetone is used. Concentration of the solvent is properly decided according to a variety of the resist.

In the case of directly using a discharged composition as a mask, a composition made by descomposing or dispersing an insulator into the solvent is used as a composition discharged from a discharging portion. A resin material such as a epoxy resin, an acrylic resin, a phenol resin, a novolak resin, a melamine resin, an urethane resin, and the like is used for the insulator. When these resin materials are used, viscosity of the resin materials is adjusted by dissolving or dispersing the insulator with the use of the solvent. A compound material made by a polymerization of a siloxane polymer and the like, a composition including a water-soluble homopolymer and a water-soluble copolymer, and the like are used for the insulator. The siloxane polymer is cited as a typical example of a material wherein a skeletal structure is formed with a combination of silicon and oxygen and a substituent contains at least hydrogen, or a material including at least one of fluorine, alkyl group, and aromatic hydrocarbon in the substituent. Various materials belonging to the same category as the above-described condition can be used for the insulator. The siloxane polymer has a distinguished planarity, and also has a transparency and a heat resistance. Heat treatment can be conducted with a temperature lower than approximately from 300° C. to 600° C. after the insulator comprising the siloxane polymer is formed.

Amount of the composition discharged at a time from the ink head 104 is preferably from 10 pl to 70 pl (in wider range, from 0.001 pl to 100 pl), viscosity is preferably at most 100 cp, and grain size is preferably at most 0.1 µm (in wider range, at most 1 µm), and film thickness is preferably approximately from 0.5 µm to 5 µm. The adjustment of the composition characteristic is conducted for keeping from drying out. When the viscosity is too high, the composition cannot be discharged smoothly from a discharging portion. The viscosity of the composition, surface tensity, and drying rate are properly adjusted in accordance with a solvent to be used and purpose. The composition discharged from the ink head 104 is preferably formed in a linear shape by subsequently dropping the composition on the substrate. However, the composition may be dropped on a predetermined area, per dot, for example. A width of a resist pattern can be controlled by controlling number of the ink head 104 which discharges the composition, depending on the nozzle diameter of the ink head 104.

When formation of resists is completed, a pre-bake treatment is conducted at approximately 100° C. for the purpose of curing the resists. As the heat treatment, a lamp annealing apparatus in which the substrate is directly and rapidly heated by using a lamp such as halogen lamp as a heat source or a laser irradiation apparatus in which the substrate is irradiated with a laser beam is used. The heat treatment can be performed only on the desired area by scanning the heat source itself in the both apparatuses. As other methods, an annealing furnace that is set at a predetermined temperature may be used. When the laser beam is used, a beam spot of the laser beam emitted from a laser oscillator on the substrate is preferably have a linear shape so as to be the same length as a row or a column of the substrate. By doing this, the laser irradiation can be finished by scanning once.

Exposure treatment is performed. (FIG. 1B) The exposure treatment denotes treatment wherein a mask 77 to which a desired pattern is printed in advance is overlapped with the resists 74, 75, and 76, and is irradiated with ultra violet rays from above. According to the present treatment, a surface of the substrate is divided into a several area, and is irradiated with light within a photosensitive wavelength region of the photosensitizer with the use of the light source such as an ultraviolet lamp.

Subsequently, developing treatment wherein a portion of a resist irradiated with ultraviolet rays by the exposure is soaked into a developer so as to be removed is performed. The printed patterns by the exposure become actual resist patterns 78 to 80. (FIG. 1C) Post-baking treatment in which the resist patterns are baked again at approximately 120° C. is conducted.

Etching treatment is performed to a part of a film that is not covered with the resist patterns 78 to 80 in order that the part of the film is to be removed. (FIG. 1D) For the etching treatment, either a wet etching which performs corrosion in etchant such as sulfuric acid, nitric acid, phosphoric acid, and hydrofluoric acid, or a dry etching to which a RIE (reactive ion etching) is typically applied may be used, and may be appropriately selected in accordance with objects or applications. Etching gas may be selected in accordance with the object to be processed, and a fluorine-based etching gas such as $CF_4$, $NF_3$, and $SF_6$, or a chlorine-based etching gas such as $Cl_2$, and $BCl_3$ can be used. According to the embodiment mode, the conductive film is etched so as to be a tapered shape, using that the resist is also etched by using gas combined with oxygen during the etching treatment in the case that the resist is an organic material.

At the last, a resist stripper is used to remove resist patterns 84 to 86 which function as a mask, and subsequently conductive layers 81 to 83 are formed. (FIG. 1E) One of the following steps is employed to remove the resist: a plasma ashing wherein the resist is removed by reacting with a plasma gas and vaporizing; an ozone ashing wherein the resist is vaporized by reacting with the oxygen radical generated by dissolving $O_3$ (ozone); or a wet station to which the most suitable etchant tank to melt the resist is mounted.

Oxygen gas is typically used for the plasma ashing. Since the resist is a solid substance made of carbon, oxygen, and hydrogen, a phenomenon that the resist becomes gas such as $CO_2$, $H_2O$ and $O_2$ by a chemical reaction with oxygen plasma is used for the plasma ashing. This principle is the same in the ozone ashing. In the case of using the plasma ashing or the ozone ashing, the wet station is preferably used for cleaning the resist, since an impurity such as heavy metal comprised in an actual resist is not removed.

As shown in FIG. 3A, the ink jetting is employed to form conductive layers 730 and 740. Then, as shown in FIG. 3B, the resist pattern may be formed by the ink jetting. The conductive layers and the resist can be continuously formed by just changing a composition material filled in the ink head or by changing the ink head filled with the composition. The conductive layers 730 and 740 can be a conductive gate electrode, a source wiring, a drain wiring, a pixel electrode, and an opposite electrode. Such conductive layers are formed by the ink jetting, the resist pattern is continuously formed according to the present invention, and the resist is used, thereby forming a desired pattern.

As described above, a pattern of the conductive layers 81 to 83 can be formed over the glass substrate 101. According to the embodiment mode, a mode to form a pattern comprised of a conductive material over the glass substrate 101 is exemplified, but the present invention is not limited thereto. The present invention can be applied to various steps such as a step of forming a wiring and a contact hole of a semiconductor integrated circuit, a step of forming a silicon island, a wiring, and a contact hole of a TFT substrate to form a liquid crystal panel and an EL panel, and the like. The present invention is not limited to the conductive layer exemplified here, and a method for manufacturing the resist pattern of the present invention can be applied on an insulating film such as oxide silicon and an acrylic resin and on a semiconductor film such as polycrystalline silicon and amorphous silicon. The method for manufacturing the resist pattern of the present invention can be used to form a semiconductor device formed with a thin film technology.

Embodiment Mode 2

In the embodiment mode, a liquid crystal display panel that is formed of a transistor composed of amorphous silicon using the present invention is described with reference to drawings. According to the embodiment mode, a method for manufacturing a resist pattern of the present invention is applied so as to form a gate electrode.

Figure 12A:
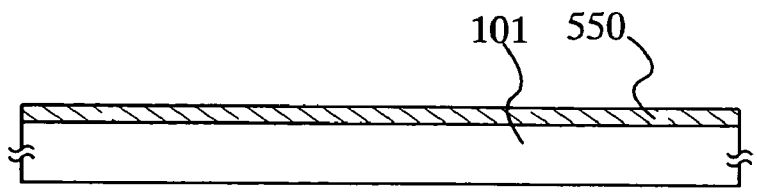
FIGS. 12A to 12F are cross sectional views explaining a manufacturing method of the present invention.

A substrate 101 is formed of various materials such as glass, quartz, a semiconductor, a plastic, a plastic film, metal, a glass epoxy resin, and ceramic. A conductive film 550 is formed of a material having a conductive material by using plasma CVD or sputtering so as to cover the substrate 101. (FIG. 12A)

Figure 12B:
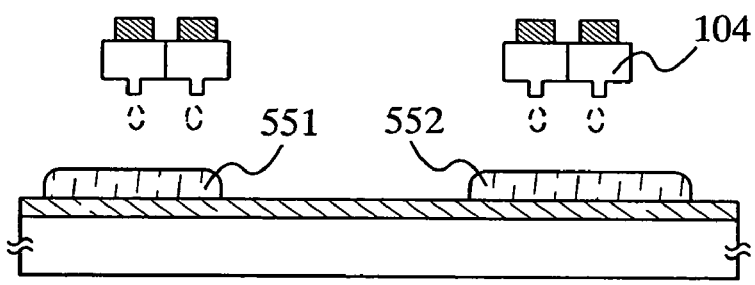

A photoresist (photosensitive resin) that is sensitive to ultraviolet rays is applied on the conductive film 550 by an ink jetting under reduced pressure to form resists 551 and 552. (FIG. 12B) Since a step of spin coating is not required in the present invention in which the resist is formed by the ink jetting, efficiency in the use of a resist material is increased drastically. In the case of employing the spin coating, the resist is formed at an edge portion of a periphery of the substrate. According to the present invention, since the resist can be formed only on a desired area, a step of edge cleaning required when the step of the spin coating is conducted can be reduced.

Figure 12C:
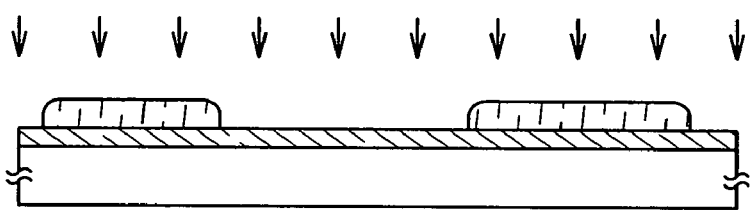

When formation of the resists 551 and 552 is completed, pre-bake treatment is conducted at approximately 100° C. for the purpose of curing the resists. Then, exposure treatment is performed. (FIG. 12C) The exposure treatment denotes treatment wherein a mask (not illustrated) to which a desired pattern is printed in advance is overlapped with the resists 551 and 552, and the mask is irradiated with ultraviolet rays from above. According to the present treatment, a whole surface of the substrate is divided into a several area, and is irradiated with light within a photosensitive wavelength region of the photosensitizer with the use of the light source such as an ultraviolet lamp.

Figure 12D:
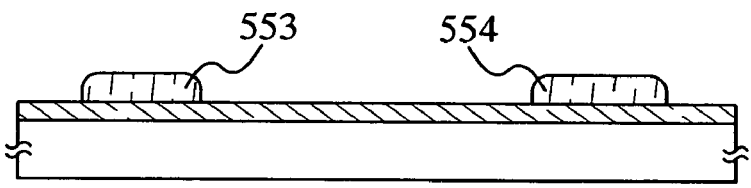

Subsequently, developing treatment wherein a portion of a resist irradiated with ultraviolet rays by the exposure treatment is soaked into a developer to be removed is performed. According to the present invention, printed patterns by the exposure become actual resist patterns 553 and 554. (FIG. 12D) Post-baking treatment in which the resist patterns are baked again at approximately 120° C. is conducted.

Figure 12E:
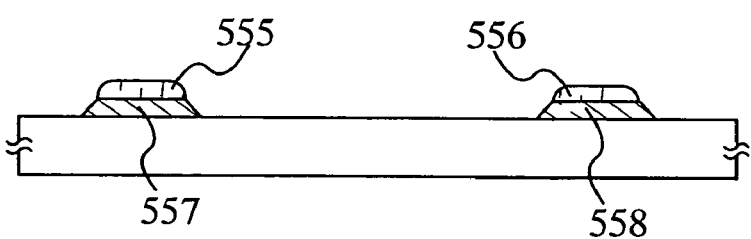

Etching treatment is performed to a part of a film that is not covered with the resist patterns 553 and 554 so as to remove the part of the film. (FIG. 12E) For the etching treatment, either a wet etching or a dry etching may be used, and may be appropriately selected in accordance with objects or applications. According to the embodiment mode, conductive films 557 and 558 are etched so as to be a tapered shape, using that the resist is also etched by using gas combined with oxygen during the etching treatment in the case that the resist is an organic material.

Figure 12F:
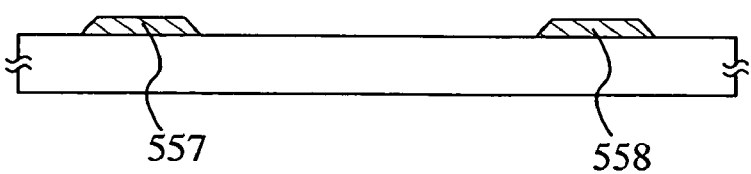

At the last, a resist stripper is used to remove resist patterns 555 and 556 that function as a mask. (FIG. 12F) One of the following steps is employed to remove the resist: the plasma ashing, the ozone ashing, or the wet station.

Figure 13A:
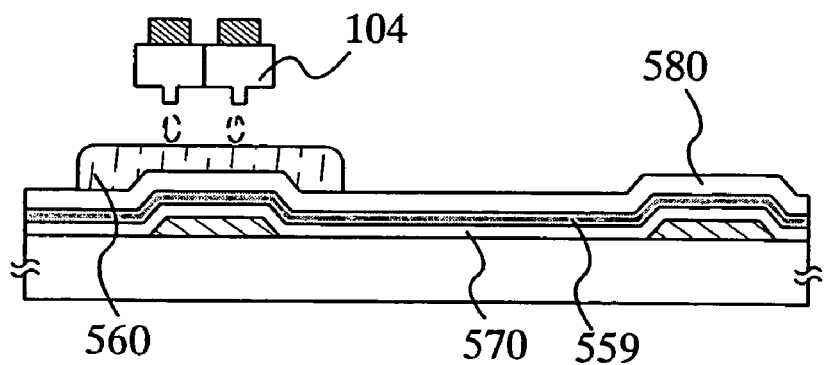
FIGS. 13A to 13D are cross sectional views explaining a manufacturing method of the present invention.

Then, a gate insulating film 570 is formed by a known method such as CVD. In the embodiment mode, a silicon nitride film is formed as the gate insulating film 570 at atmospheric pressure by CVD. (FIG. 13A) A semiconductor film 559 is formed to have a thickness of from 25 nm to 80 nm (preferably, from 30 nm to 60 nm) by a known method (sputtering, LPCVD, plasma CVD, and the like). The semiconductor film 559 is formed of a compound semiconductor film and the like having an amorphous structure such as an amorphous semiconductor film, or amorphous silicon germanium film. A channel protective film 580 such as a silicon nitride film is formed on the semiconductor film 559. A resist 560 is formed on the channel protective film 580 under reduced pressure by the ink jetting.

Figure 13B:
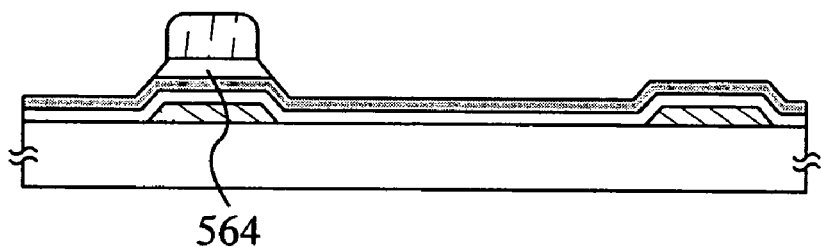

As described above, a channel protective film 564 is formed after an exposure treatment from the backside using an electrode 557, developing treatment to melt a portion wherein the resist is exposed with the developer, etching treatment, and at last resist stripping treatment. (FIG. 13B)

Figure 13C:
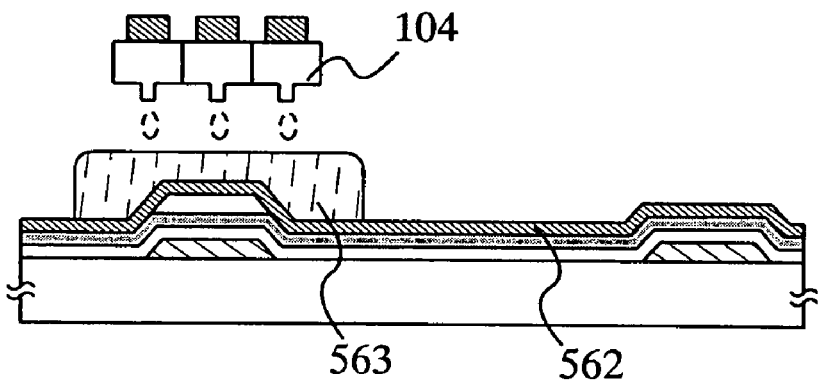
Figure 13D:
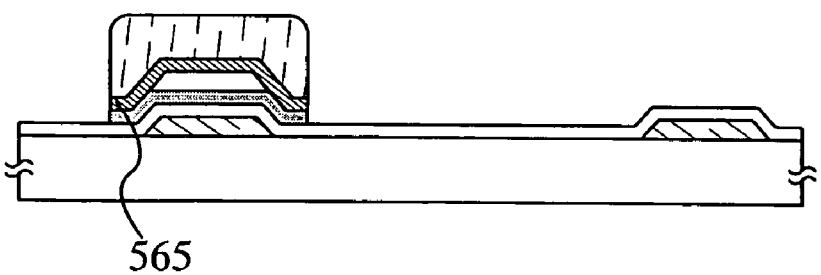

A semiconductor film 562 doped with an impurity element for imparting an N-type (one type of conductivity) is formed. The resist 560 is formed on the semiconductor film 562 under reduced pressure by the ink jetting. (FIG. 13C) As described above, an N-type semiconductor layer 565 is formed after the exposure treatment, the developing treatment, the etching treatment, and the resist stripping treatment. (FIG. 13D)

Figure 14A:
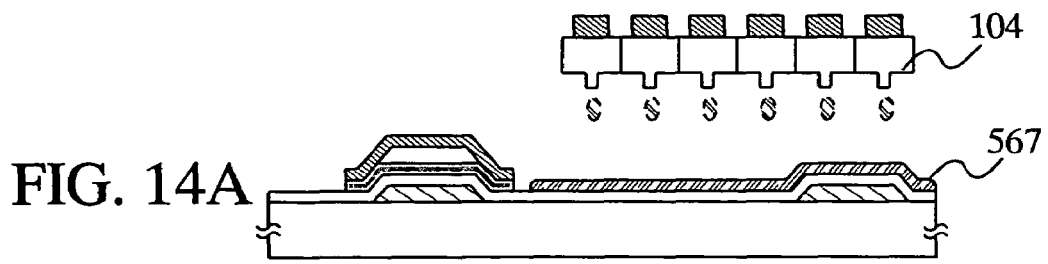
FIGS. 14A to 14E are cross sectional views explaining a manufacturing method of the present invention.

A conductive film 567 is formed under reduced pressure by the ink jetting (FIG. 14A). The conductive film 567 is formed by the ink jetting after changing a composition filled in the ink head 104 or by changing the ink head filled with the composition. As the composition discharged from the ink head 104, the one in which conductive materials properly chosen from an element selected from tantalum (Ta), tungsten (W), titanium (Ti), molybdenum (Mo), aluminum (Al), copper (Cu), chromium (Cr), niobium (Nb), or an alloy material or a compound material containing the foregoing elements as a major component are dissolved and dispersed in a solvent can be used. Depending on a direction of light inside a panel, the material is selected appropriately because the conductive film 567 is required to be formed of a transparent material. The conductive film 567 is formed over the whole surface of the substrate 101 using not the ink jetting but a known technique such as plasma CVD or sputtering, and then may be patterned into a desired shape. When the conductive film 567 is formed by the ink jetting, the conductive film can be formed only in the desired area. Therefore, the wasted material can be reduced, and the efficiency in the use of the material can be enhanced.

Figure 14B:
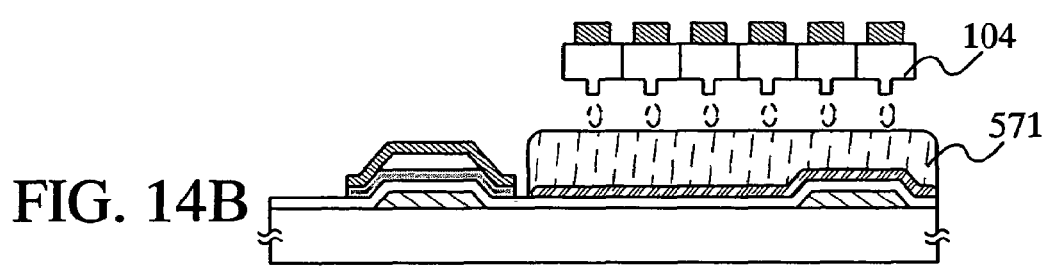
Figure 14C:
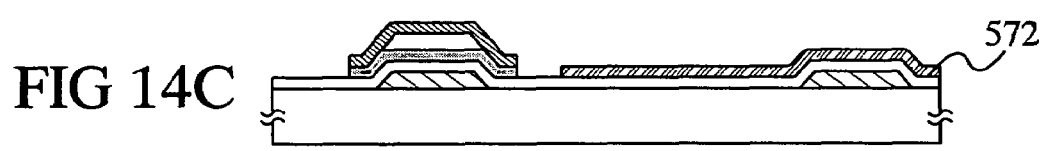

After forming the conductive film 567, the method for manufacturing the resist pattern of the present invention is employed to form a resist 571 under reduced pressure by the ink jetting. (FIG. 14B) As described above, a conductive layer 572 which is patterned into a desired shape after the exposure treatment using a photomask, wherein a pattern is formed, the developing treatment with the developer to melt a portion of the resist which is exposed, the etching treatment, and at last the resist stripping.

Figure 14D:
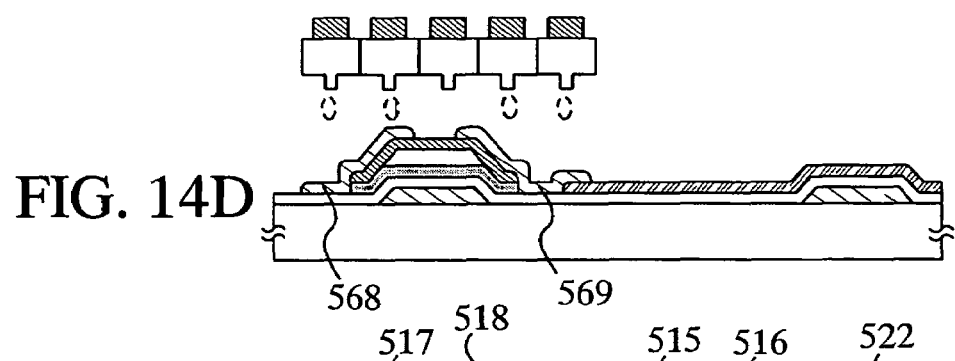

Subsequently, as is the case with formation of the conductive layer 572, conductive films 568 and 569 having source and drain wirings are formed under reduced pressure by the ink jetting. (FIG. 14D) In the case that the conductive films are formed by the ink jetting, the conductive film can be formed into a desired shape in some cases without requiring a step of the exposure, depending on the nozzle diameter of the ink head. In that case, steps of the exposure and the like can be omitted. In the embodiment mode, the steps are omitted.

Figure 14E:
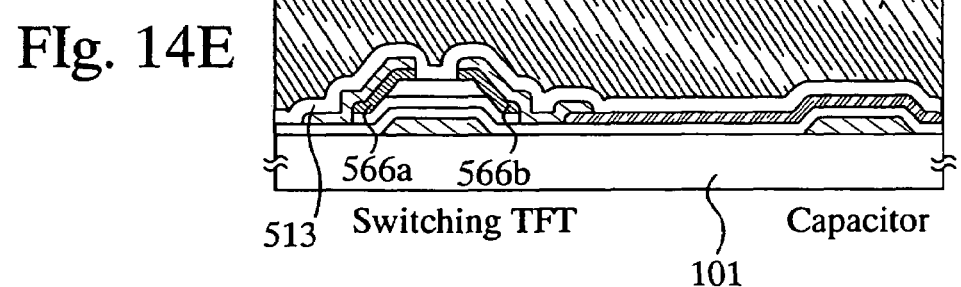

Using the conductive films 568 and 569 that are source and drain wirings as a mask, N-type semiconductor layers 566a and 566b are formed by selectively etching. (FIG. 14E) After manufacturing a protective film 513 formed of silicon nitride and the like, the protective film and an opposite substrate 518 in which a common electrode 515, a color filter 516, a black matrix 517, and the like are formed are laminated. And liquid crystal 522 is injected thereto.

Figure 15A:
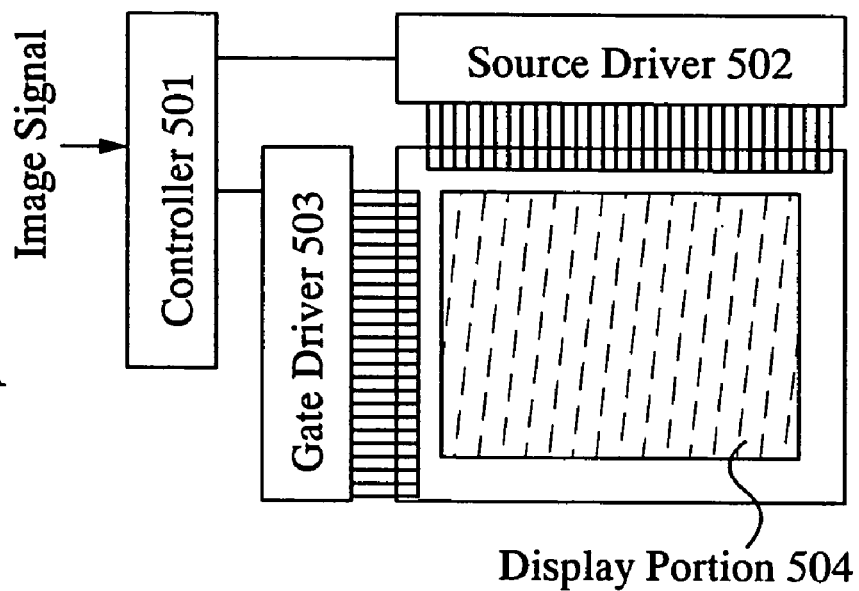
FIGS. 15A to 15C are diagrams showing a display panel.
Figure 15B:
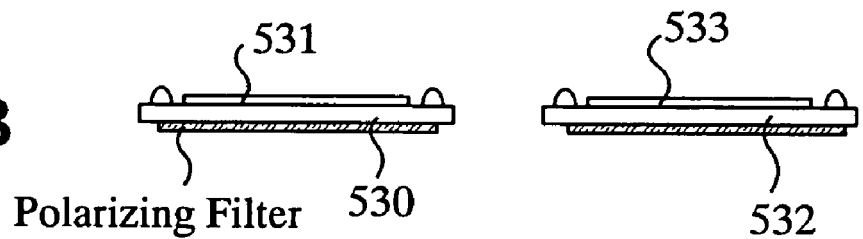
Figure 15C:
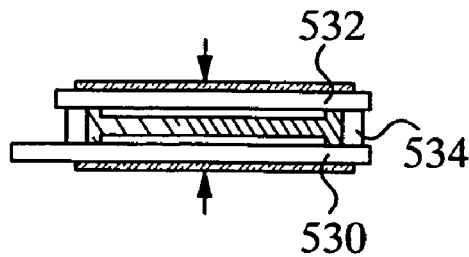

In FIG. 15B, an array substrate 530 over which a pixel portion 531 comprising a TFT and the like is formed and a color filter substrate 532 over which a common electrode 533 is formed are shown. As shown in FIG. 15C, the two substrates are bonded at peripheries of the two substrates with a sealant 534 while keeping an interval between the two substrates of from 5 μm to 6 μm. The sealant 534 is provided with a sealant spacer so as to precisely keep the interval of the two substrates. An in-plane spacer is placed between the substrates, and the interval is filled with the liquid crystal.

A top view of a liquid crystal display panel is shown in FIG. 15A. A reference numeral 501 denotes a controller for controlling a circuit, 502 denotes a source driver, 503 denotes a gate driver, 504 denotes a display portion. According to the embodiment mode, a circuit of other than the display potion is not to be monolithic in the case of forming of the amorphous semiconductor. As for the circuit of other than the display portion, an IC (integrated circuit) or the like is mounted.

Figure 16:
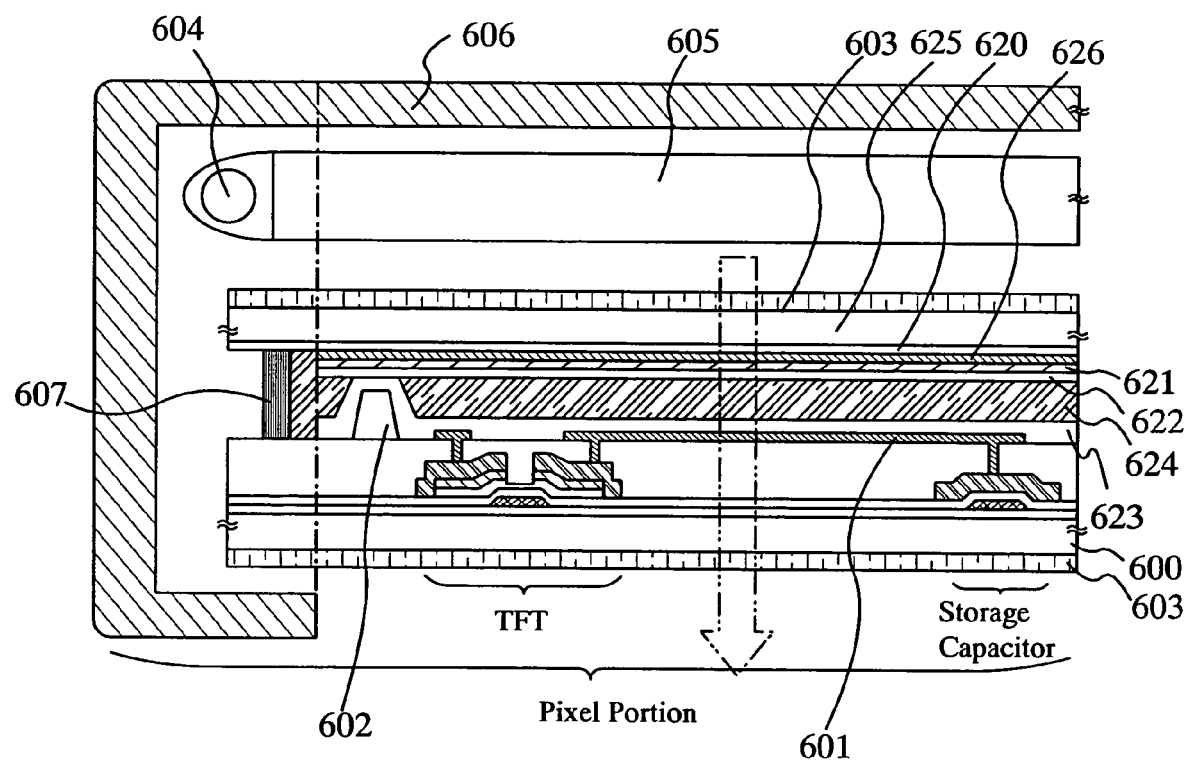
FIG. 16 is a cross sectional view of a display panel.

A step for manufacturing an active matrix liquid crystal display device is described as below with reference to FIG. 16.

First, an active matrix substrate is formed of a substrate 600 that is transparent to light. The substrate with a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is desirably used thereby reducing a manufacturing cost. A substrate made of barium borosilicate glass, aluminoborosilicate glass, and the like, as typified by #7059 glass or #1737 glass produced by Coming Inc. can be used. In addition, a transparent substrate such as a quartz substrate or a plastic substrate can be used alternatively.

After the conductive film is formed by sputtering over the whole surface of the substrate 600 having an insulating surface, a first step of photolithography is performed to form a resist pattern on the conductive film. An unnecessary portion of the conductive film is removed by etching or the like, thereby forming a wiring and an electrode. (a gate electrode, a capacitor wiring, a terminal, and the like) Note that, a base insulating film is formed on the substrate 600, if necessary. Hereinafter, the present invention is applied to a step of photolithography. According to the present invention in which the resist is formed by the ink jetting, the step of the spin coating is not required, efficiency in the use of the resist material can be widely enhanced, and a manufacturing cost can be reduced.

An element selected from a group consisting of Ti, Ta W, Mo, Cr, and Nd, an alloy containing the elements, or a nitride containing the elements may be used for the material of the wiring or the electrode. Further, a plurality of a material selected from an element selected from the group consisting of Ti, Ta W, Mo, Cr, and Nd; an alloy containing the foregoing elements as a component; or a nitride containing the foregoing elements as a component may be laminated.

When a screen size becomes larger, length of each line is increased. And a problem of higher wiring resistance occurs and power consumption is increased. Accordingly, the wirings and the electrodes may be formed with an element selected from a group consisting of Cu, Al, Ag, Au, Fe, Ni, or Pt or an alloy thereof so as to achieve low power consumption.

Subsequently, the gate insulating film is deposited entirely over the substrate by PCVD. The gate insulating film is formed with a lamination of the silicon nitride film and the silicon oxide film so as to have a thickness of from 50 nm to 200 nm, preferably 150 nm. Note that the gate insulating film is not necessarily to be a lamination; and a silicon oxide film, a silicon nitride film, a silicon oxynitride film, a tantalum oxide film, or the like may be used alternatively.

After removing the resist, a first amorphous semiconductor film is formed entirely on the gate insulating film using known techniques such as plasma CVD or sputtering with a thickness of from 50 nm to 200 nm, preferably from 100 nm to 150 nm. Typically, an amorphous silicon (a-Si) film is formed into a thickness of 100 nm. Note that, when the films are formed over a substrate with a large area, a chamber is also enlarged, and if an inside of the chamber is evacuated, more treating time and a large amount of film formation gas are required. Accordingly, the amorphous silicon (a-Si) film may be formed at atmospheric pressure by linear plasma CVD apparatus.

Thereafter, a second amorphous semiconductor film that contains an impurity element having one conductive type (N-type or P-type) is formed so as to have a thickness of from 20 nm to 80 nm. The second amorphous semiconductor film including an impurity element that imparts one conductivity type (N-type or P-type) is deposited entirely, by using known techniques such as plasma CVD or sputtering. In this embodiment, the second amorphous silicon film containing an N-type impurity element is deposited by using a silicon target added with phosphorus.

Next, a resist pattern is formed by a second step of photolithography, and an unnecessary portion is etched away, thereby forming a first amorphous semiconductor island film and a second amorphous semiconductor island film. On this occasion, the etching is carried out by the wet etching or the dry etching.

After forming a conductive layer covering the second amorphous semiconductor island film by sputtering, a third step of photolithography is performed to form a resist pattern. An unnecessary portion is etched away, thereby forming a wiring and an electrode (a source wiring, a drain electrode, a capacitor electrode, and the like). A material for the above-mentioned wirings and electrodes may be formed with an element selected from a group consisting of elements such as Al, Ti, Ta W, Mo, Cr, Nd, Cu, Ag, Au, Fe, Ni, and Pt, or an alloy containing the foregoing elements as a component. At this stage, a storage capacitor in which the insulating film formed of the same material as the gate insulating film is to be a dielectric material is formed.

A resist pattern is formed by a forth step of photolithography, and an unnecessary portion is etched away, thereby forming a source wiring, a drain electrode, and a capacitor electrode. On this occasion, the etching is carried out by the wet etching or the dry etching. Then, the one part of the second amorphous semiconductor film is removed in a self-alignment manner by using the source wiring or the drain electrode as a mask, and the one part of the first amorphous semiconductor film is thinned. The thinned region becomes a channel formation region of the TFT.

A protective film formed of a silicon nitride film with a thickness of 150 nm and a first interlayer insulating film formed of a silicon oxynitride film with a thickness of 150 nm are formed entirely by plasma CVD. Note that, in the case where the films are formed over a substrate with a large area, the chamber is also enlarged, and in the case that the inside of the chamber is evacuated, more treating time and a large amount of film formation gas are required. Accordingly, the amorphous silicon (a-Si) film may be formed by linear plasma CVD at atmospheric pressure. Thereafter, a channel etch type TFT is finished by hydrogenation.

Note that, a channel etch type is given as an example of a TFT structure in the embodiment mode; however, the structure is not limited thereto. Any one of the structures of a channel stopper type TFT, a top gate TFT, or a staggered TFT may be applied.

Next, a fifth step of photolithography process is carried out; a resist pattern is formed; a contact hole reaching a drain electrode or a capacitor electrode is formed by dry etching. Concurrently, a contact hole (not illustrated) for electrically connecting a gate wiring and a terminal portion may be formed in a terminal portion, and a metal wiring (not illustrated) for electrically connecting a gate wiring and a terminal portion may be formed. Further, a metal wiring for leading out from a source wiring may be formed after forming the contact hole (not illustrated) which reaches the source wiring at the same time. A pixel electrode formed from ITO or the like may be formed after the above metal wirings are formed, or the metal wirings may be formed after the pixel electrode formed from ITO or the like is formed.

An indium tin oxide (ITO), an indium oxide-zinc oxide alloy ($In_2O_3$—ZnO), zinc oxide (ZnO), and the like are applied to form a transparent electrode film having a thickness of 110 nm, and subsequently, a sixth step of photolithography and a step of etching are performed to form a pixel electrode 601.

As described above, an active matrix substrate composing a pixel portion having a source wiring, an inversely staggered TFT, a storage capacitor, and a terminal portion can be manufactured by six steps of photolithography.

An orientation film 623 is formed over the active matrix substrate and rubbing treatment is performed thereto. According to the embodiment mode, before forming the orientation film 623, a columnar spacer 602 for keeping the substrate interval is formed in the desired area by patterning an organic resin film such as an acrylic resin film. Instead of the columnar spacer, a spherical spacer may be used on a whole surface of the substrate.

An opposite substrate 625 is prepared. The opposite substrate 625 is provided with a color filter 620 in which a light-shielding layer (not illustrated) is arranged in response to each pixel. In addition, a planarization film 626 is provided so as to cover the color filter 620 and the light-shielding layer. Then, an opposite electrode 621 formed of a transparent conductive film is formed over the planarization film 626 so as to overlap with the pixel portion. An orientation film 622 is formed over the whole surface of the opposite substrate 625, and rubbing treatment is performed thereto.

After forming a sealant 607 so as to surround the pixel portion of the active matrix substrate, liquid crystal 624 is discharged over the region surrounded by the sealant under reduced pressure by the ink jetting. The active matrix substrate and the opposite substrate are bonded under reduced pressure with the sealant 607. Filler (not illustrated) is mixed in the sealant 607. Therefore, the two substrates are bonded with an even interval by the filler and the columnar spacer 602. According to a method in which the liquid crystal is discharged by the ink jetting, amount of the liquid crystal used for the manufacturing steps can be reduced, and the cost can be drastically reduced particularly when using a large sized substrate.

Thereupon, in the embodiment mode, the substrate is pasted to the opposite substrate provided with the sealant after the liquid crystal material is discharged (or dripped) only over the pixel electrode that are formed over the substrate, namely, over the pixel portion under reduced pressure by employing the ink jetting. Both applying a sealant and dripping liquid crystal may be performed on the opposite substrate or on the substrate provided with the pixel portion.

A piezo system that is applied for ink-jet printers may be employed for the ink jetting since controllability of an ink drop is higher and the kind of ink can be selected freely. Note that, the piezo system has two types: a MLP (Multi Layer Piezo) type and a ML Chip (Multi Layer Ceramic Hyper Integrated Piezo Segments) type.

In this embodiment mode, a liquid crystal display device can be manufactured by discharging (or dripping) a few drops of a small amount of the liquid crystal toward the pixel electrode. By using the ink jetting, the small amount of the liquid crystal such as the number of discharging and the number of a discharging point can be freely adjusted.

It is preferable to discharge (or to drip) the liquid crystal by the ink jetting under reduced pressure thereby preventing a impurity from being mixed. While the liquid crystal is discharged (or dripped), the viscosity of the liquid crystal is set to the desired level by heating the substrate. Further, the film thickness may be uniformed by spinning the substrate after dripping the liquid crystal by the ink jetting, if necessary. It is preferable to paste the substrates under reduced pressure to prevent bubbles from being mixed thereinto.

As described above, because needed volume of the liquid crystal is dropped onto a needed area, a loss of the material can be eliminated. Further, the seal pattern is to be a closed loop. Hence, formation of the sealant for a liquid crystal inlet becomes unnecessary. Therefore, the defect (such as an orientation defect, for example) that is generated when the liquid crystal is injected may be eliminated.

The liquid crystal material may be mixed with a photo-curing material, a thermosetting material, or the like thereby improving adhesion between the pair of substrates after the injection of the liquid crystal.

A material that does not dissolve into liquid crystal is preferably selected for the sealant.

The gap between the pair of substrates may be maintained by sprinkling spherical spacers, forming a columnar spacer formed of a resin, or mixing fillers into the sealant.

Thus, the active matrix type liquid crystal display device can be finished. Note that, if necessary, the active matrix substrate or the opposite substrate is cut into a desired shape. Further, an optical film such as a polarizing filter 603 is provided properly by using known techniques. An FPC is further pasted to the substrate using known techniques.

A liquid crystal module obtained according to the above steps is provided with a backlight 604 and an optical waveguide 605. An active matrix type liquid crystal display device (transsmissive type) is completed by covering the liquid crystal module with a cover 606. A part of a cross sectional view thereof is shown in FIG. 16. Note that, the cover and the liquid crystal module are fixed with an adhesive or an organic resin. The polarizing filter 603 is pasted to both of the active matrix substrate and the opposite substrate, since the liquid crystal display device is a transmissive type.

Further, an example of the transmissive type is shown in this embodiment; however, it is not limited thereto, and a reflective or a semi-transparent liquid crystal display device can also be manufactured. When the reflective liquid crystal display device is obtained, a metal film with high reflectance, typically, a material film containing aluminum or silver as major proportion, or a lamination of those may be used for the pixel electrode.

Embodiment 1

Figure 4:
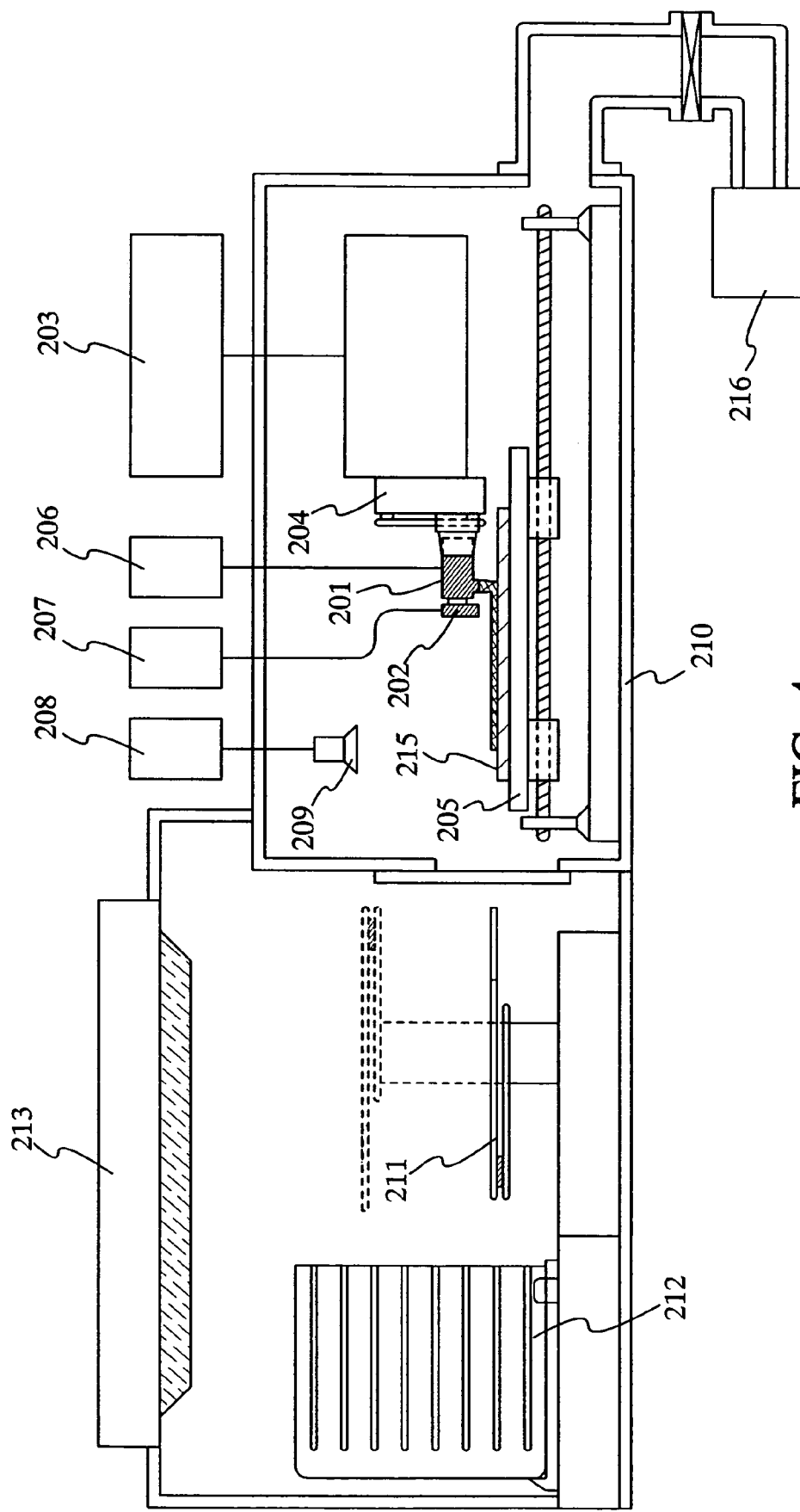
FIG. 4 shows an apparatus using ink jetting.

Embodiment of the present invention is described with reference to FIGS. 4 to 6. FIG. 4 shows a structure of a printer using ink jetting.

As shown in FIG. 4, the discharging period and the movement speed of a substrate 215 are regulated so as to continuously form a resist pattern from a composition discharged from an ink head 201 on the substrate. A nozzle 202 for discharging gas may be provided adjacent to the ink head 201 as a means of smoothing the composition. Using the gas discharged from the nozzle 202, the composition discharged over the substrate 215 is smoothed. A linear pattern is formed by relatively moving the ink head 201 and the substrate, at this time; the pattern can be smoothed by discharging the gas from the nozzle. Further, a gap between the ink head 201 and the substrate 215 is preferably maintained at a distance equal to or less than 1 mm in order to increase accuracy of a impact position of the discharged composition. To that end, a structure in which a movement mechanism 204 for moving the ink head 201 upwards and downwards and a control means 203 for controlling the movement mechanism are provided, and can be brought near to the ink head only during pattern formation is required.

As for other structures, components such as a substrate stage 205 for fixing the substrate 215 by a vacuum chuck and the like while moving the substrate in the XYθ direction, a means 206 for supplying the composition to the ink head 201, a means 207 for supplying the gas to the nozzle 202, and a vacuum evacuation means 216 for evacuating the processing chamber are used. A casing 210 covers parts such as the ink head 201 and the substrate stage 205. A showerhead 209 serves for controlling the processing chamber to have proper atmosphere. Other accompanying constituents such as a carrier 212 for holding substrates to be processed, a conveyor means 211 for removing the substrates from or into the carrier and placing the substrates into the cassette, and a clean unit 213 for reducing dust in a work region by sending out clean air may be provided.

Figure 5:
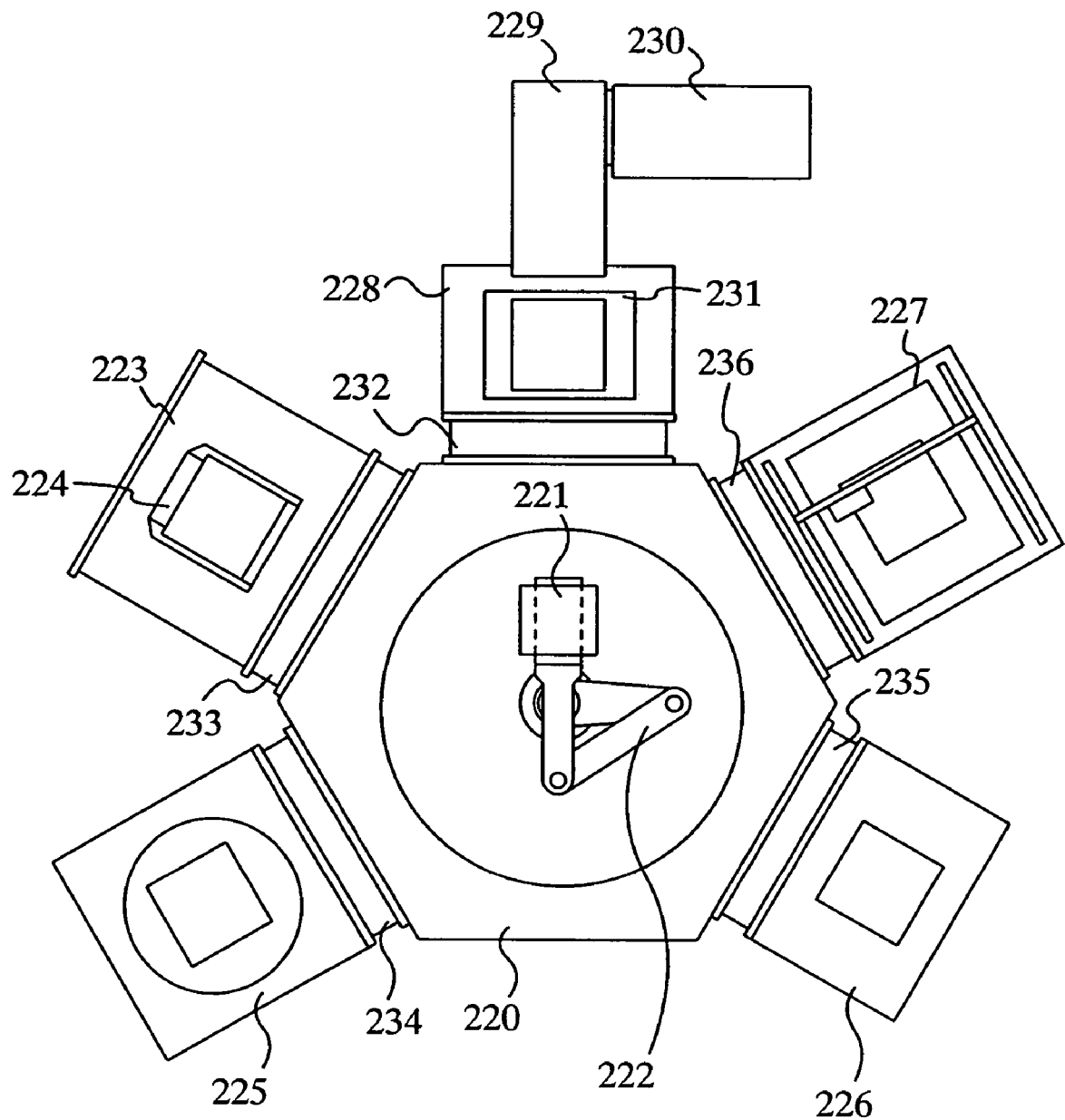
FIG. 5 is a diagram showing a multi chamber.

FIG. 5 shows a structure of a multi chamber in which the above-mentioned printer is incorporated. A conveying chamber 223 that performs loading and unloading of a substrate is also referred to as a load-unload chamber. A carrier 224 in which the substrate is set is placed here. Further, a common chamber 220 contains a mechanism (hereafter referred to as a conveying mechanism) 222 for conveying a substrate 221. Mechanisms such as a robot arm for handling of the substrate can be cited as the conveying mechanism 222.

Plural processing chambers are connected to the common chamber 220 through the gates 232 to 236. A vacuum evacuation-processing chamber 226 is the one having a vacuum pump for evacuating the common chamber 220. In the structure of FIG. 5, the common chamber 220 is in the reduced pressure (vacuum), and the each processing chamber is shut off with the common chamber 220 by the gates 232 to 236. The vacuum pump is provided for the each processing chamber, and is used in vacuum. A rotary oil pump, a mechanical booster pump, a turbo-molecular pump, or a cryo-pump can be used for the evacuation pumps, however, a cryo-pump which is effective at removing moisture is preferably used.

In this invention, a resist pattern is formed in a processing chamber for the ink jetting 227. A substrate holding means, apparatuses shown in FIG. 4, and the like are provided for the ink jet processing chamber 227. Heat treatment is performed in a laser irradiation chamber 228. The laser irradiation chamber 228 which is shut out form the atmosphere includes: a position control means for setting a substrate and controlling the position of the substrate; a laser oscillator 230; an optical system 229; a stage 231, and a computer with a central processing unit and a storage means such as a memory.

A film formation processing chamber 225 is a chamber for forming a passivation film. A silicon nitride film, a silicon nitride oxide film, or the like is used to form the passivation film by plasma CVD. Therefore, gas supply system such as silane($SiH_4$), nitrogen oxide($N_2O$), and ammonia($NH_3$), a plasma generation means using a high frequency power source, a substrate heating means, and the like are provided, though not illustrated. In the multi chamber, a film formation chamber may be provided for the purpose of the other thin films in addition to the passivation film.

According to the device having the above-mentioned structure, a resist pattern is characterized by forming by the ink jetting. Further, the laser irradiation chamber and a film formation chamber of the passivation film are all installed in a multi chamber manner. Therefore, for example, from the step of forming a coating film to the step of forming the resist pattern can be performed without exposing to the air. Note that other apparatuses such as a resist stripping apparatus shown in FIG. 6 and the like may be mounted on the multi chamber.

Figure 6:
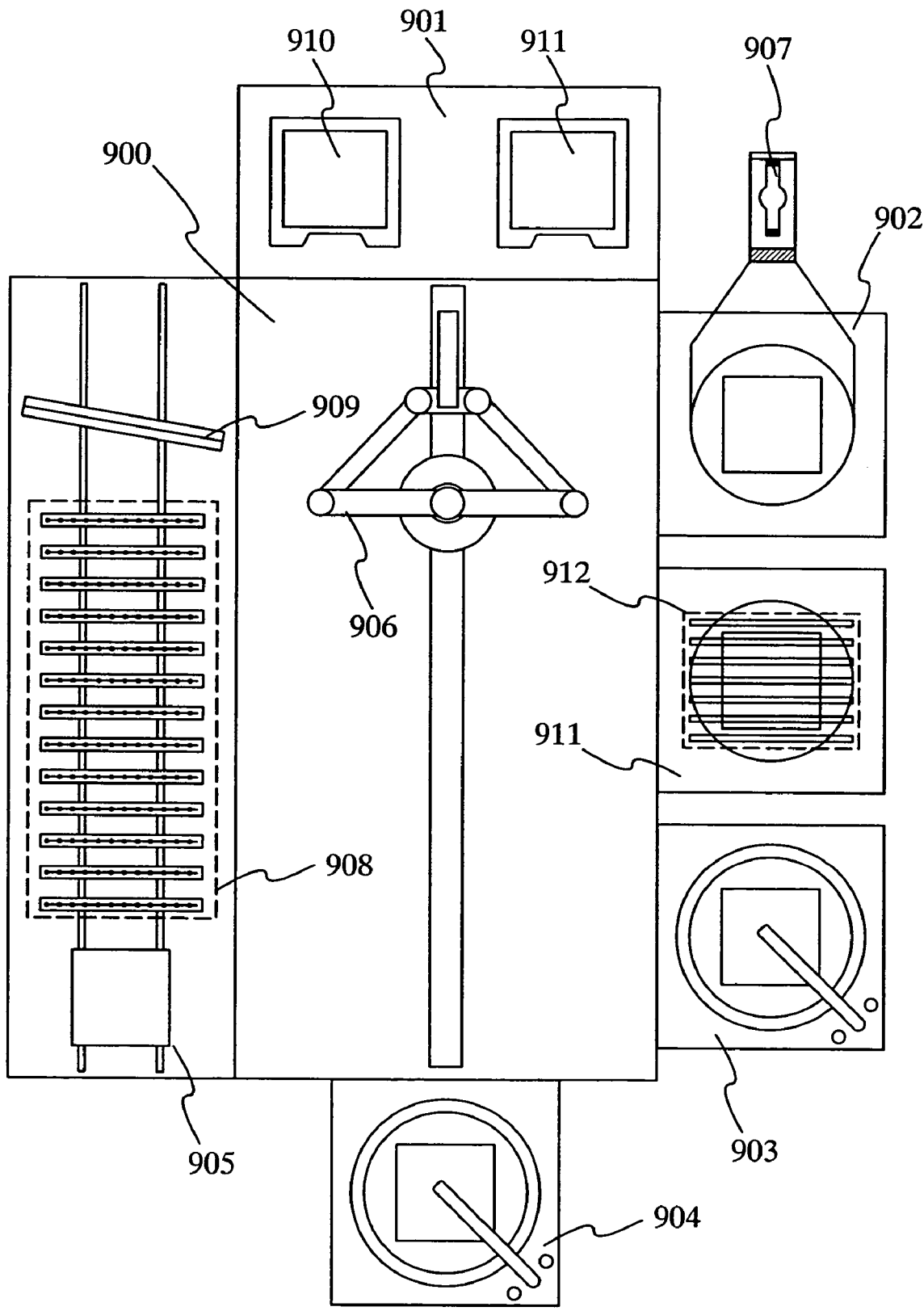
FIG. 6 is a diagram explaining a resist stripping apparatus.

The resist stripping apparatus as shown in FIG. 6, being of a sheet-base treatment system which can treat substrates to be processed on a sheet-by-sheet basis in a continuous manner, comprises a transport chamber 900 placed in a center position thereof, an exposure treatment chamber 902, stripping treatment chambers 903, 904, a rinsing chamber 905 and a loading/unloading chamber 901 around the transport chamber 900. The substrate to be processed is supplied from a substrate cassette 910 provided in the loading/unloading chamber 901 and collected by ar substrate cassette 911. The substrate is transported to each chamber by a conveyor means 906 provided in the transport chamber 900. The stripping treatment chambers 903, 904 are a treating chamber of a spin coating method respectively and each performs resist stripping treatment by supplying a resist stripper or a rinsing treatment after stripping by supplying IPA or pure water As the rinsing chamber 905, a rinsing method of a line system provided with a shower nozzle 908 and a drying device 909 comprising an air blower is illustrated, but a rinsing treatment by a spin method may be applied. Further, an IR chamber 911 is a place in which the substrate is preheated by a heating device 912 using a halogen lamp or an infrared ray lamp. An ashing apparatus, a dry etching apparatus, or the like may be installed in the resist stripping apparatus. In other words, such a resist stripping apparatus as described above may be installed in the ashing apparatus or the dry-etching apparatus of a separate multi-chamber type.

In the exposure treating chamber 902, provided is the treating unit 907 for emitting light within the photosensitive wavelength region of the photosensitizer on the resist pattern. As for the light within the photosensitive wavelength region of the photosensitizer, light having a wavelength of from 350 nm to 450 nm is typically required, though depending on types of photosensitizers. As for a light source which satisfies the above-described wavelength region, an ultra high-pressure mercury lamp which is typically used as a light source for an equivalent projection aligner utilizing light having a multiple of wavelengths or a equivalent projection exposure apparatus utilizing light having a single wavelength is exemplified as a suitable example and constituted such that it can emit light having a multiple of wavelengths comprising the g-line (436 nm), h-line (405 nm), and i-line (365 nm) which are each spectral light of the ultra high-pressure mercury lamp. In order to perform such irradiation, a structure comprising an optical filter, an ultra high-pressure mercury lamp as a light source, and an electric power supply line for supplying electric power to the ultra high-pressure mercury lamp is provided. As for the optical filters, an absorption filter and a thin-film interference filter are conceivable whereupon these filters are appropriately laminated to allow light having a multiple of wavelengths comprising the g-line (436 nm), h-line (405 nm), and i-line (365 nm) to be spectrally transmitted. Further, though a treating period of light irradiation may not be so severely defined as the exposing period in the exposure apparatus, since the treating period gives an influence on softening a shape of the resist pattern, it is required to constitute the apparatus such that a light irradiation treatment can be performed for a predetermined period. In such apparatus structure, though not illustrated, a means such that a shutter mechanism or a mechanism for supplying electric power to the ultra high-pressure mercury lamp only for a predetermined period is installed is considered.

This embodiment mode can be freely combined with the above-described embodiment modes.

Embodiment 2

FIG. 8A is a top view of a plasma treatment apparatus of the present invention and FIG. 8B is a cross-sectional view of the same. In the FIG. 8A and 8B, reference numeral 3021 is a cassette chamber for an object to be processed 3012. The object to be processed 3012 such as a glass substrate, a resin substrate, and a semiconductor substrate wherein surface treatment is conducted respectively is set in the cassette chamber 3021. As the object to be processed 3012, a substrate of a desired size is used regardless of the substrate size, that is, a large-sized substrate (for example, 300 mm×360 mm) and a normal size substrate (for example, 127 mm×127 mm). Note that, a pretreatment such as cleaning is preferably carried out beforehand for the object to be processed which is to be set in the cassette chamber 3021.

Reference numeral 3022 denotes a transport chamber, and the object to be processed 3012 placed in the cassette chamber 3021 by a transport mechanism 3020 is transported to a plasma treatment chamber 3023 by using a robot arm. In the plasma treatment chamber 3023 adjacent to the transport chamber 3022, conveyor means 3018 for making airflow so as to cut off the air for the dust proof, and for transporting the object to be processed 3012, a heating means 3019, and a plasma generation means 3025 are provided. A known heating means such as a halogen lamp may be used for the heating means 3019, which is used for heating toward the upper surface of the object to be processed 3012. The conveyor means 3018 and an exit portion of gas 3026 control the airflow using a transporting gas such as an inert gas provided from a gas supply means 3029. In the present invention, the plasma treatment apparatus is operated under an atmospheric pressure or around atmospheric pressure; therefore, pollution from the external and flow back of reaction product can be prevented by solely controlling airflow near the plasma generation means 3025 by the conveyor means 3018. Accordingly, it is also possible to separate externally solely by the conveyor means 3018, and there is no need to seal the plasma treatment chamber 3023 completely. In addition, in the present invention, it does not need time for vacuuming and an atmospheric opening which are required for pressure reducing equipment and arrangement of a complicated vacuum system.

Moreover, gas provided from the gas supply means 3029 is heated to a desired temperature (from 50° C. to 800° C.) by a heating means 3028. And the object to be processed 3012 is heated by blowing this heated gas to the object to be processed 3012. The heating means 3028 is not limited in particular, as long as it can heat gas, and a known means may be used. In the present invention, the lower side of the object to be processed 3012 is heated by being blown by the heated gas, and furthermore, the upper side of the object to be processed 3012 is heated by the heating means 3019. As mentioned, the object to be processed 3012 is heated uniformly by heating both side of the object to be processed 3012. Moreover, the inert gas may be used for the transporting gas that is provided from the gas supply means 3029.

The plasma generation means 3025 is composed of a first electrode and a second electrode, and is connected to a high frequency power source 3017, an exhausting system, a gas supply means, and the like. In the plasma treatment chamber 3023, the object to be processed 3012 that has finished predetermined surface treatment is transported to a transport chamber 3024, and is transported to another treatment chamber from the transport chamber 3024.

Either or both of the first and the second electrodes are preferably covered with a solid dielectric material. A metal oxide such as aluminum oxide, zirconium dioxide, titanium dioxide, a plastic such as polyethylene terephthalate, and polytetrafluoroethylene, oxide such as silicon dioxide, barium titanate, and glass can be noted as the solid dielectric material. The shape of the solid dielectric material may be sheet like or film like, however the thickness is preferably from 0.05 mm to 4 mm. This is because the thin solid dielectric material causes arc discharge due to the dielectric breakdown, in the case of the film is thin, generated when applying voltage since high voltage is required to generate discharge plasma.

Further, a program that can perform plasma treatment to the desired region, namely, only a region in which a resist to be performed by ashing is arranged or a periphery thereof, is inputted in a CPU inside a plasma treatment apparatus. According to this, gas to be supplied can be saved and a manufacturing cost can be reduced.

It is an object of the present invention to provide the plasma treatment apparatus and the method for plasma treatment in which the object to be processed is uniformly heated by being blown with the heated gas; the object to be processed is horizontally floated and moved without condition of contact by the gas; and the plasma treatment is performed efficiently. Moreover, by the airflow control means for discharging the gas in a vertical direction and an oblique direction, the entire surface of the object to be processed (especially, suitable for a substrate having a large size) is transformed, the object to be processed is exposed to blowing and sucking simultaneously in the airflow control means to adjust the floated height of the object to be processed, and the horizontal accuracy of the object to be processed is adjusted with the gas flow to adjust the height of the object to be processed accurately. According to the present invention having above structure, the control of the distance between the plasma and the object to be processed can be carried out easily. Furthermore, without being limited by the size of the object to be processed, a plasma treatment can be carried out properly and easily by transporting depending on the shape of the surface of the object to be processed.

In addition, according to the above-described plasma treatment apparatus that performs treatment at atmospheric pressure, a deposition rate of a coating film by CVD, an etching rate, and an ashing rate are improved. Furthermore, surface treatment of a number of times can be carried out continuously by placing the plasma generation means in order in the treatment chamber; therefore, a manufacturing apparatus is simplified. In the case of forming the coating film by the CVD, the coating film is preferably made by forming the plasma into a linear shape and by scanning the plasma having the linear shape.

This embodiment mode can be freely combined with the above-described embodiment modes.

Embodiment 3

Embodiment of the present invention is described with reference to FIGS. 7 and 11. The embodiment explains a cross-sectional structure of a display device having a TFT manufactured by applying a method for manufacturing a resist pattern of the present invention to formation of a semiconductor layer, a gate electrode, a source wiring, a drain wiring, and the like.

A transistor to be disposed in a driving circuit portion and in a pixel portion is formed on an insulating surface. (FIG. 7A) In FIG. 7A, an N-type TFT 109 and a P-type TFT 110 are shown as a TFT to be disposed in the driving circuit portion, and a switching TFT 106 and a driving TFT 107 is shown as a TFT to be disposed in the pixel portion. Then, a first electrode 40 formed of a transparent conductive material is formed so as to electrically connect to a wiring 26 of the driving TFT 107. The transparent conductive film is preferably formed of a material having a larger work function. For example, a compound of indium oxide and tin oxide (ITO), a compound of indium oxide and zinc oxide, zinc oxide, tin oxide, indium oxide, titanium nitride or the like can be used. In the embodiment mode, an ITO film is formed to have a thickness of 0.1 μm by sputtering as the first electrode 40.

Figure 7A:
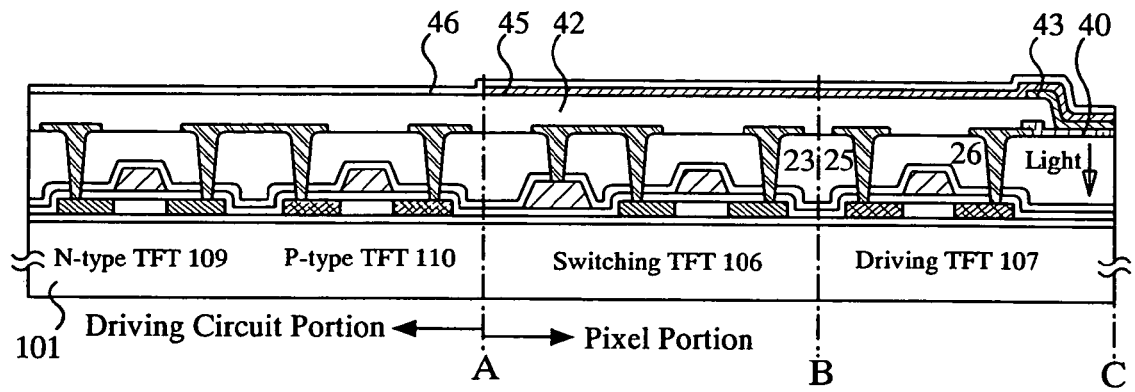
FIGS. 7A to 7E are cross sectional views, a top view of a thin film transistor and a circuit diagram of one pixel.
Figure 7B:
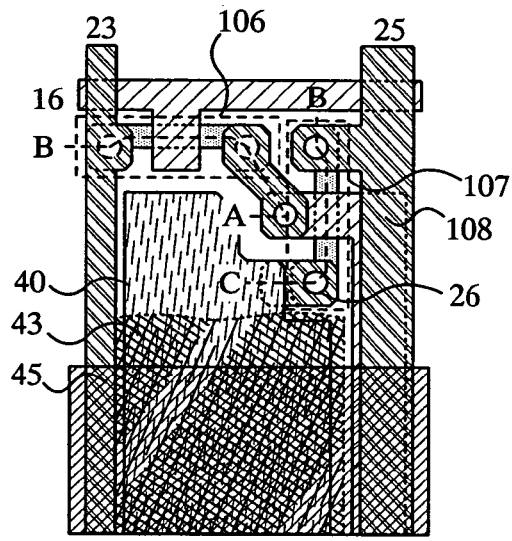

According to the embodiment, after forming the wiring 26, a method for forming the transparent conductive film so as to electrically connect to the wiring 26 is described. However, other methods may be employed to form the transparent conductive film. For instance, the wiring 26 of the TFT may be formed after forming the transparent conductive film and after patterning the transparent conductive film. A cross-sectional structure at that time is shown in FIG. 7D. After forming the wiring 26 of the TFT, an insulating film is formed and a contact hole is opened on the insulating film so as to reach the wiring 26. A transparent conductive film may be formed so as to electrically connect to the wiring 26. A cross-sectional structure at that time is shown in FIG. 7E.

Figure 11A:
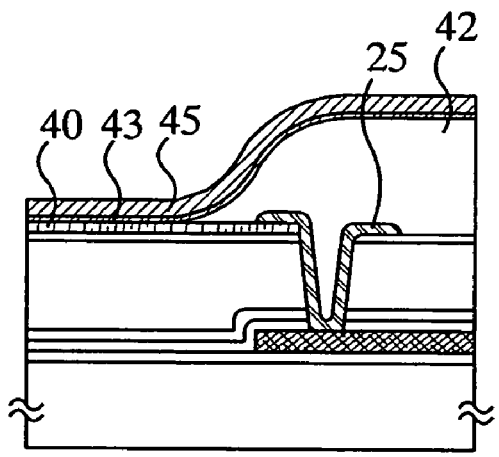
FIGS. 11A to 11C are cross sectional views of a thin film transistor.
Figure 11B:
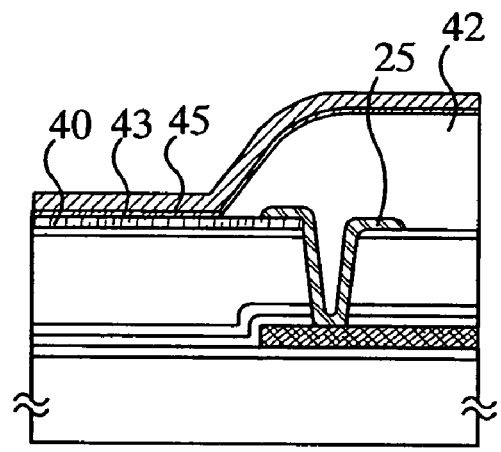
Figure 11C:
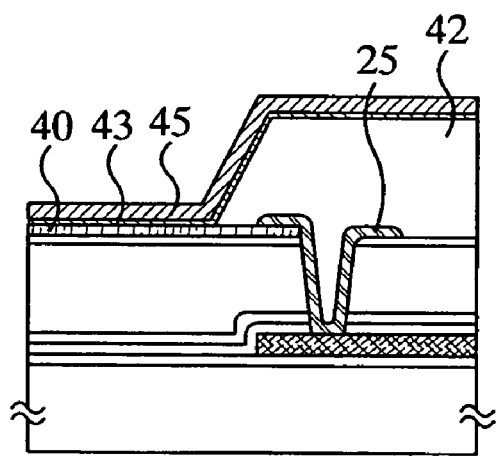

Next, an insulating film 42 is formed so as to cover the end face of the first electrode 40. A material for forming the insulating film 42 is not specifically limited and an inorganic or an organic material can be used. However, the insulating film is preferably formed using a photosensitive organic substance since a light-emitting layer can be deposited without a break in a shape of the opening portion. In the case of using a negative type photosensitive resin as the material of the insulating film 42, the insulating film 42 is formed to have a curved surface with a first curvature in an upper portion of the insulating film 42 and a curved surface with a second curvature in a lower portion of the insulating film 42, as shown in FIG. 11A. The first and the second curvature radiuses are preferably set at from 0.2 μm to 3 μm, and an angle of a pass-through to the first electrode 40 is preferably set at equal to or more than 35°. In the case of using a positive type photosensitive resin as the material of the insulating film 42, the opening portion is to be a curved shape having a curvature radius in an upper portion of the insulating film as shown in FIG. 11B. In addition, when the opening portion of the insulating film 42 is manufactured by dry etching, the shape is to be the one shown in FIG. 11C. Then dust and the like are removed by wiping the insulating film with a porous material of polyvinyl alcohol (PVA). In the embodiment, fine powder (dust) generated when the first electrode 40 or the insulating film is etched is removed by wiping with the porous material of the polyvinyl alcohol (PVA).

Then, an electroluminescent layer 43 is formed so as to contact the first electrode 40. The electroluminescent layer 43 is formed by vapor deposition and by application (spin coating, ink jetting, and the like). According to the embodiment, the vapor deposition is performed while an evaporation source holder is moved with the use of a vapor deposition apparatus. For instance, the vapor deposition is conducted in a film formation chamber vacuumed to degree of vacuum of 5×10⁻3 Torr (0.665 Pa) or lower, preferably from $10^{-4}$ Torr to $10^{-6}$ Torr. The organic compound which is the material for the electroluminescent layer is previously vaporized by resistance heating and is scattered in a direction of the substrate by opening a shutter during deposition. In other words, the vaporized organic compound is scattered in an upward direction and is deposited over the substrate by passing an opening portion provided for a metal mask, thereby forming the electroluminescent layer 43.

In processing before the vapor deposition of the electroluminescent layer, PEDOT may be applied on the entire surface and baking may be conducted. At this time, after the PEDOT is applied, washing is preferably conducted and the PEDOT is applied again, because the PEDOT has low wettability with ITO. After heating at normal pressures to evaporate moisture, heating is conducted in a reduced pressure atmosphere.

According to the present invention, one layer or plural layers provided between the first and the second electrodes that constitute a light-emitting element is referred to as the electroluminescent layer 43. The electroluminescent layer 43 can be formed by using at least one material selected from a group consisting of a low molecular organic compound material and a polymeric organic compound material, or mixtures thereof approximately. Further, a mixed layer in which an electron transporting material and a hole transporting material are appropriately mixed, or a mixed bonding in which a mixed region is formed in a bond interface of each material may be formed. In addition to the organic materials, an inorganic light emitting material may be used. Further, a structure of the electroluminescent layer 43 is not particularly limited, and a structure in which a layer formed of a low molecular material is laminated or a structure in which a layer formed of a polymer material and the layer formed of the low molecular material are laminated may be adopted.

Subsequently, a second electrode 45 is formed on the electroluminescent layer 43. The second electrode 45 is formed of a laminated film of a thin film including a metal having a small work function (Li, Mg, Cs) and a transparent conductive film laminated on the thin film including Li, Mg, or the like. The film thickness is properly set so as to serve as a cathode, here, it is set at from 0.1 μm to 1 μm by a known method (electron beam deposition and the like). In the case that an electron beam deposition is employed, radiation is generated when acceleration voltage is too high, and a TFT is damaged. However, when the acceleration voltage is too low, film deposition speed is slowed down and productivity is decreased. The second electrode 45 is deposited so as not to excessively be thicker than the film thickness that can functions as the cathode. When the second electrode 45 is thin, the productivity is not affected significantly even if the film deposition speed is slow. Although a problem of increase in resistance arises when the cathode is thin, Al and the like which is a low-resistance metal is formed on the cathode by a resistance heating evaporation or sputtering to be a laminated structure in order to solve the problem. According to the embodiment, Al—Li is formed to be 0.1 μm in thickness as the second electrode 45 by the electron beam deposition.

Then, a protective film 46 is formed over the insulating film 42 and the second electrode 45. A film that is hardly penetrated by a substance such as moisture or oxygen that becomes a cause of accelerating degradation of the light emitting element, compared to other insulating films is used as the protective film 46. Typically, a DLC film, a carbon nitride film, a silicon nitride film formed by RF sputtering, or the like is used. A film thickness thereof is preferably approximately from 10 nm to 200 nm. In the embodiment, the silicon nitride film is formed to have a thickness of 100 nm by sputtering.

Figure 7C:
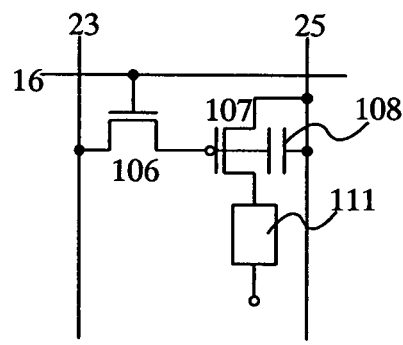
Figure 7D:
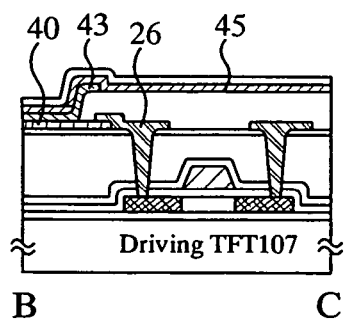
Figure 7E:
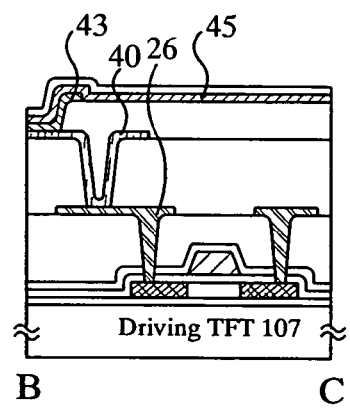

A laminated body of the first electrode 40, the light-emitting layer 43 and the second electrode 45, which are formed in the above described process is comparable to the light-emitting element 111 in FIG. 7C. The first electrode 40 corresponds to an anode, and the second electrode 45 corresponds to a cathode. There are single excitation and triplet excitation as excitation state for the light-emitting device 111, and luminescence can be generated through either excitation states.

FIG. 7B shows a top view of one pixel in a display apparatus using the light-emitting element. In the top view in FIG. 7B, a cross sectional view which is equivalent to A-B-C is corresponding to FIG. 7A. Also, FIG. 7C shows a circuit diagram of one pixel corresponding to FIG. 7B. In FIGS. 7B and 7C, reference numeral 16 denotes a signal line, 23 denotes a scanning line, 25 denotes a power source line, 106 denotes a switching TFT, 107 denotes a driving TFT, 108 denotes a capacitor element, and 111 denotes the light-emitting element.

In the embodiment, the case where bottom emission in which light emitted from the light-emitting element is taken out from a side of the substrate 101 (bottom side) is performed is shown. However, an upper emission in which light is taken out form the surface of the substrate 101 may be performed, instead. In that case, the first electrode 40 is formed so as to correspond to the cathode, and the second electrode 45 is formed so as to correspond to an anode. Further, the second electrode 45 is preferably formed of a transparent material. Also, the TFT for driving 107 is preferably formed of an N-channel TFT. However, a conductive type of the driving TFT 107 may be properly changed, the capacity element 108 is to be arranged so as to keep voltage between the gate and the source. In this embodiment, a light-emitting device using the light-emitting element is illustrated as an example; however, the present invention can be applied to other display devices such as the liquid crystal display device.

This embodiment mode can be freely combined with the above-described embodiment modes.

Embodiment 4

Figure 9A:
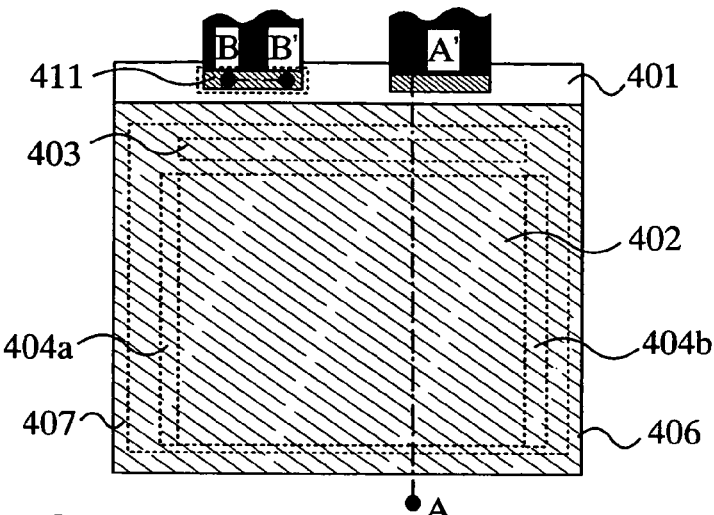
FIGS. 9A to 9E are diagrams showing a display panel.
Figure 9B:
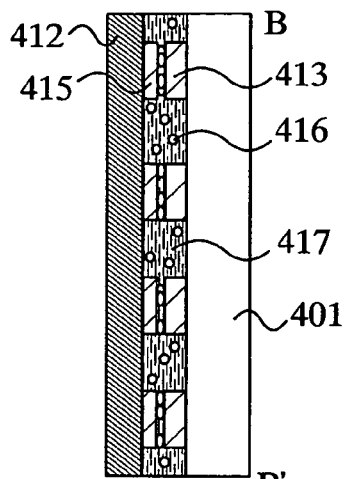
Figure 9C:
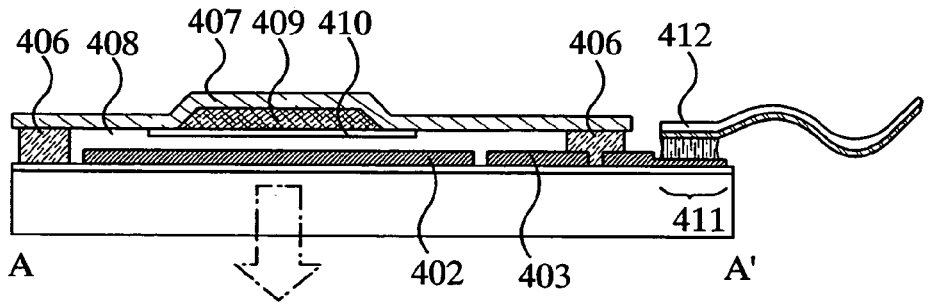
Figure 9D:
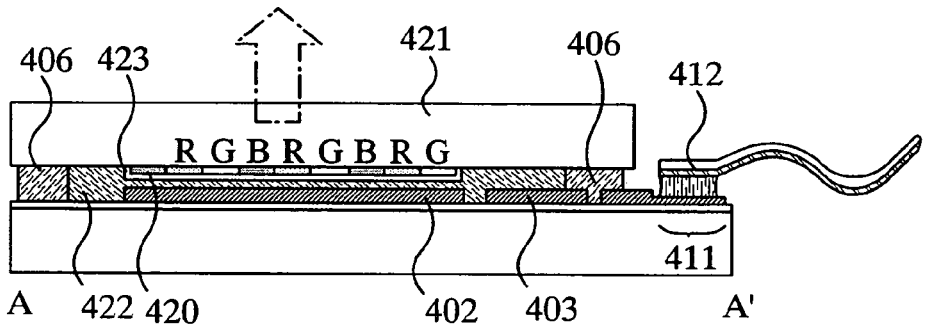

Embodiment of the present invention is described with reference to FIGS. 9A to 9E. FIG. 9A is a top view of a display panel formed by sealing a substrate in which a transistor is formed with a sealing material. FIG. 9B is a cross sectional diagram along a line B-B' in FIG. 9A. FIGS. 9C and 9D are cross sectional diagrams along a line A-A' in FIG. 9A.

In FIGS. 9A to 9C, a pixel portion (display portion) 402, a signal line driver circuit 403 which is provided so as to surround the pixel portion 402, and scanning line driver circuits 404a and 404b are all located over a substrate 401, and a seal material 406 is provided to surround the all. As the seal material 406, a glass material, a metal material (typically, a stainless steel material), a ceramic material, or a plastic material (including a plastic film) may be used.

The sealant 406 may be provided to partially overlap with the signal line driver circuit 403, and the scanning line driver circuits 404a and 404b. A sealing material 407 is bonded to the substrate 401 using the seal material 406, so that a closed space 408 is formed by the substrate 401, the seal material 406, and the sealing material 407. A hygroscopic agent 409 (barium oxide, calcium oxide, or the like) is provided in advance in a concave portion of the sealing material 407, so that it has a function of absorbing moisture, oxygen, and the like to keep an atmosphere clean in an inner portion of the above-described closed space 408, thereby suppressing a deterioration of the light-emitting element. The concave portion is covered with a covering material 410 with a fine mesh shape. The covering material 410 allows air and moisture to pass therethrough but not the hygroscopic agent 409. Note that the closed space 408 is preferably filled with a noble gas such as nitrogen or argon, or may be filled with a resin or a liquid if it is inert.

Also, an input terminal portion 411 for a transmitting signal to the signal line driver circuit 403 and to the scanning line driver circuits 404a and 404b is provided over the substrate 401. A data signal such as video signal is transferred to the input terminal portion 411 through a FPC (flexible printed circuit) 412. With respect to a cross section of the input terminal portion 411, as shown in FIG. 9B, an input wiring 413 formed of a wiring which is formed together with the scanning wiring or the signal wiring is electrically connected with a wiring 415 provided on the FPC 412 side through a resin 417 in which an electric conductor 416 is dispersed. Note that a spherical polymer compound plated with gold or silver is preferably used for the electric conductor 416.

In a display panel as shown in FIG. 9D, a transparent opposite substrate 421 is provided using the seal material 406, so that a closed space 422 is formed by the substrate 401, the opposite substrate 421, and the seal material 406. A color filter 420 and a protective film 423 for protecting the color filter are provided for the opposite substrate 421. Light emitted from a light-emitting element arranged in the pixel portion 402 is exteriorly discharged through the color filter, and a multi color display is carried out. The closed space, 422 is filled with an inactive resin or a liquid. In the case of carrying out the multi color display, an electroluminescent layer is set to emit each color of RGB or a pixel provided with the electroluminescent layer that emits a white color is set to arranged in order that the color filter and a color conversion layer are used.

Then, a panel provided with a memory circuit and a CPU in addition to a pixel portion and a driver circuit for controlling the pixel portion on the same insulating surface is explained with reference to FIG. 9E.

Figure 9E:
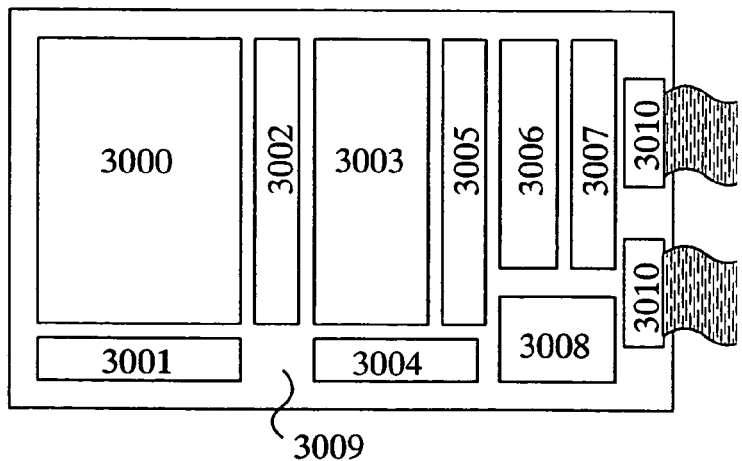

FIG. 9E shows an appearance of the panel. The panel has a pixel portion 3000 wherein plural pixels are arranged in matrix over a substrate 3009. A scanning line driver circuit 3001 for controlling the pixel portion 3000, and a signal line driver circuit 3002 are provided at the periphery of the pixel portion 3000. In the pixel portion 3000, an image is displayed according to a signal supplied from driver circuits. An opposite substrate may be provided only over the pixel portion 3000 and the driver circuits 3001 and 3002, or may be provided over the entire surface alternatively. Note that, a CPU 3008, which is in danger of generating heat, is preferably provided with a heat sink contiguously. Further, the panel also has a VRAM 3003 (video random access memory, a screen display memory only), and decoders 3004 and 3005 at a periphery of the VRAM 3003. In addition, the panel has a RAM (random access memory) 3006, a decoder 3007 at a periphery of the RAM 3006, the CPU 3008, and a FPC 3010. All elements forming a circuit over the substrate 3009 are formed of a polycrystalline semiconductor (polysilicon) that has higher field-effect mobility and higher ON current than that of an amorphous semiconductor. Therefore, a plurality of circuits can be formed into an integrated circuit over one insulating surface. A structure of the plural pixels provided in the pixel portion is not limited. In case of providing SRAM to each of the plural pixels, the VRAM 3003 and the RAM 3006 may be omitted.

In the embodiment, an example of applying the present invention to the display panel using the light-emitting element is illustrated, however, the invention may be applied to a display panel using a liquid crystal display element. Further, the embodiment can be freely combined with other above described embodiment modes.

Embodiment 5

Various electric device can be obtained by using the present invention. The concrete examples are explained with reference to FIGS. 10A to 10C.

Figure 10A:
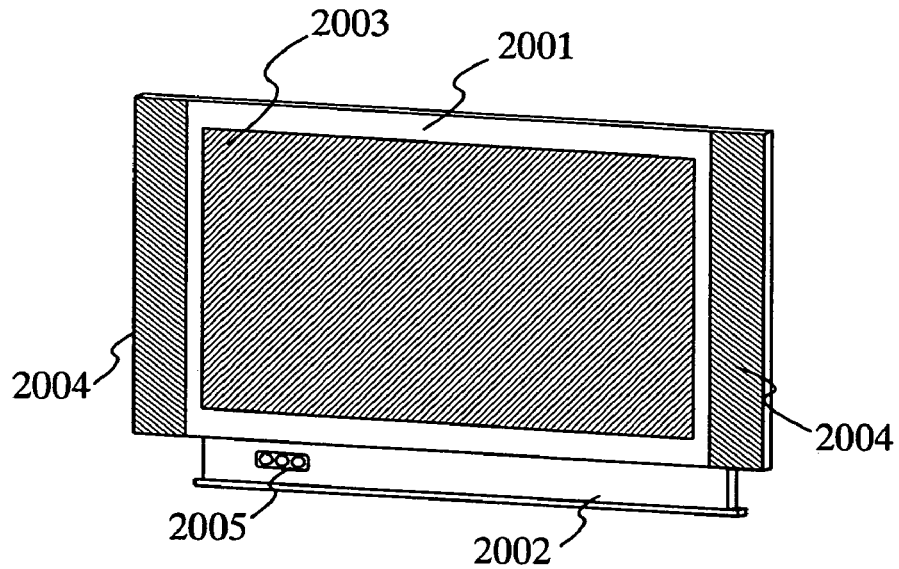
FIGS. 10A to 10C are diagrams showing an electric apparatus.

FIG. 10A is a display device, which includes a frame 2001, a support medium 2002, a display portion 2003, a speaker portion 2004, a video input terminal 2005, and the like. The invention can be applied for manufacturing the display portion 2003. In specific, the invention is suitable for manufacturing a display device having a large screen of from 20 inch to 80 inch.

Figure 10B:
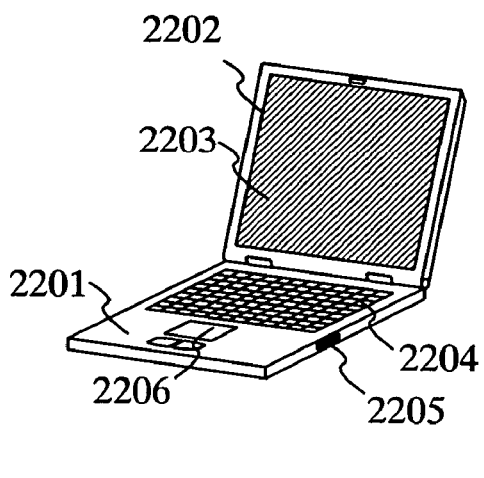

FIG. 10B is a laptop personal computer, which includes a body 2201, a frame 2202, a display portion 2203, a keyboard 2204, an exterior connection port 2205, a pointing mouse 2206 and the like. The invention can be applied for manufacturing the display portion 2203.

Figure 10C:
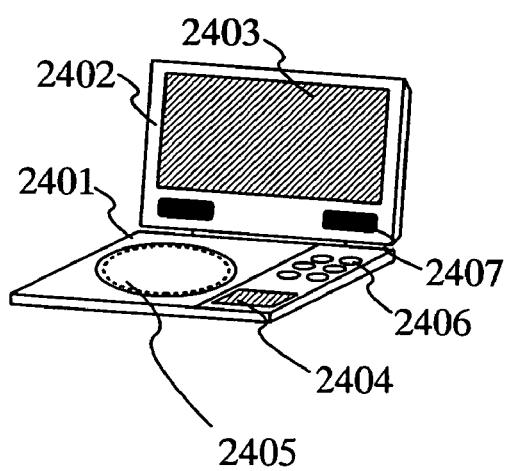

FIG. 10C is a portable image reproduction device provided with a recording medium (specifically, a DVD reproduction device), which includes a main body 2401, a frame 2402, a display portion A 2403, a display portion B 2404, a recording medium (such as a DVD) read-in portion 2405, operation keys 2406, a speaker portion 2407, and the like. The display portion A 2403 mainly displays image information, and the display portion B 2404 mainly displays character information. The invention can be applied for manufacturing the display portions A 2403 and B 2404.

As described above, this invention can be widely applied, and especially the invention can be applied for manufacturing various kinds of electric device. In addition, the invention can be freely combined with the above described embodiment modes and embodiments.

What is claimed is:

1. A method of manufacturing a semiconductor device comprising:

discharging a first composition containing a first photosensitizer on a first conductive layer to form a plurality of first resist patterns under reduced pressure;

exposing the plurality of first resist patterns by irradiation of light using a first photomask, the light having a photosensitive wavelength region of the first photosensitizer, wherein a first portion where the light is irradiated and a second portion where the light is not irradiated are formed in each of the plurality of first resist patterns;

removing one of the first portion and the second portion by developing the plurality of first resist patterns to form a plurality of second resist patterns;

etching the first conductive layer by using the plurality of second resist patterns as a mask to form a plurality of gate wirings and a plurality of gate electrodes over a substrate;

removing the plurality of second resist patterns on the first conductive layer;

forming an insulating film over the plurality of gate wirings and the plurality of gate electrodes;

forming a plurality of semiconductor islands over the plurality of gate electrodes with said insulating film interposed therebeween;

discharging a second composition containing a second photosensitizer on a second conductive layer to form a plurality of third resist patterns under reduced pressure;

exposing the plurality of third resist patterns by irradiation of light using a second photomask, the light having a photosensitive wavelength region of the second photo sensitizer, wherein a third portion where the light is irradiated and a fourth portion where the light is not irradiated are formed in each of the plurality of third resist patterns;

removing one of the third portion and the fourth portion by developing the plurality of third resist patterns to form a plurality of fourth resist patterns;

etching the second conductive layer by using the plurality of fourth resist patterns as a mask to form a plurality of pixel electrodes arranged in a matrix form over the substrate;

removing the plurality of fourth resist patterns on the second conductive layer;

discharging a third composition containing a third photosensitizer on a third conductive layer to form a plurality of fifth resist patterns under reduced pressure;

exposing the plurality of fifth resist patterns by irradiation of light using a third photomask, the light having a photosensitive wavelength region of the third photosensitizer, wherein a fifth portion where the light is irradiated and a sixth portion where the light is not irradiated are formed in each of the plurality of fifth resist patterns;

removing one of the fifth portion and the sixth portion by developing the plurality of fifth resist patterns to form a plurality of sixth resist patterns;

etching the third conductive layer by using the plurality of sixth resist patterns as a mask to form a plurality of source wirings wherein said plurality of source wirings extend across said plurality of gate wirings; and removing the plurality of sixth resist patterns on the third conductive layer.

2. A method of manufacturing a semiconductor device according to claim 1, wherein each of the first composition, the second composition, and the third composition is made by dissolving or by dispersing one of the first photosensitizer, the second photosensitizer, and the third photosensitizer into a solvent.

3. A method of manufacturing a semiconductor device according to claim 1, wherein said semiconductor device is incorporated into at least one selected from the group consisting of a display device, a personal computer and a portable image reproduction device.

4. A method of manufacturing a semiconductor device comprising:

discharging a first composition containing a first photosensitizer on a first conductive layer to form a plurality of first resist patterns under reduced pressure;

exposing the plurality of first resist patterns by irradiation of light using a first photomask, the light having a photosensitive wavelength region of the first photosensitizer, wherein a first portion where the light is irradiated and a second portion where the light is not irradiated are formed in each of the plurality of first resist patterns;

removing one of the first portion and the second portion by developing the plurality of first resist patterns to form a plurality of second resist patterns;

etching the first conductive layer by using the plurality of second resist patterns as a mask to form a plurality of gate wirings and a plurality of gate electrodes over a substrate; photomask, the light having a photosensitive wavelength region of the third photosensitizer, wherein a fifth portion where the light is irradiated and a sixth portion where the light is not irradiated are formed in each of the plurality of fifth resist patterns;

removing one of the fifth portion and the sixth portion by developing the plurality of fifth resist patterns to form a plurality of sixth resist patterns;

etching the third conductive layer by using the plurality of sixth resist patterns as a mask to form a plurality of source wirings wherein said plurality of source wirings extend across said plurality of gate wirings; and removing the plurality of sixth resist patterns on the third conductive layer.

5. A method of manufacturing a semiconductor device according to claim 4, wherein each of the first composition, the second composition, and the third composition is made by dissolving or by dispersing one of the first photosensitizer, the second photosensitizer, and the third photosensitizer into a solvent.

6. A method of manufacturing a semiconductor device according to claim 4, wherein said semiconductor device is incorporated into at least one selected from the group consisting of a display device, a personal computer and a portable image reproduction device.

7. A method for manufacturing a semiconductor device comprising the steps of:
　discharging a composition on an object to form a plurality of first resist patterns under reduced pressure, the composition containing a photosensitizer;
　removing the plurality of second resist patterns on the first conductive layer;
　forming an insulating film over the plurality of gate wirings and the plurality of gate electrodes;
　forming a plurality of first semiconductor islands over the plurality of gate electrodes with said insulating film interposed therebeween;
　forming each of a plurality of channel protective layers over each of the plurality of first semiconductor islands;
　forming a plurality of second semiconductor islands over the plurality of first semiconductor islands with the plurality of channel protective layers interposed therebeween;
　discharging a second composition containing a second photosensitizer on a second conductive layer to form a plurality of third resist patterns under reduced pressure;
　exposing the plurality of third resist patterns by irradiation of light using a second photomask, the light having a photosensitive wavelength region of the second photosensitizer, wherein a third portion where the light is irradiated and a fourth portion where the light is not irradiated are formed in each of the plurality of third resist patterns;
　removing one of the third portion and the fourth portion by developing the plurality of third resist patterns to form a plurality of fourth resist patterns;
　etching the second conductive layer by using the plurality of fourth resist patterns as a mask to form a plurality of pixel electrodes arranged in a matrix form over the substrate;
　removing the plurality of fourth resist patterns on the second conductive layer;
　discharging a third composition containing a third photosensitizer on a third conductive layer to form a plurality of fifth resist patterns under reduced pressure;
　exposing the plurality of fifth resist patterns by irradiation of light using a third photomask, the
　exposing the plurality of first resist patterns with light using a photomask, wherein a first portion where the light is irradiated and a second portion where the light is not irradiated are formed in the first resist patterns; and
　removing one of the first portion and the second portion by developing the plurality of first resist patterns to form a plurality of second resist patterns.

8. A method for manufacturing a semiconductor device according to claim 7, wherein a viscosity of the composition is at most 100 cp.

9. A method for manufacturing a semiconductor device according to claim 7, wherein an amount of the composition discharged at a time is in the range of 10 pl to 70 pl.

10. A method for manufacturing a semiconductor device according to claim 7, wherein a wavelength of the light is in the range of 350 nm to 450 nm.

11. A method for manufacturing a semiconductor device comprising the steps of:
　performing ink jetting on an object to form a plurality of first resist patterns under reduced pressure, wherein each of the plurality of first resist patterns is made of a composition containing a photosensitizer;
　exposing the plurality of first resist patterns with light using a photomask, wherein a first portion where the light is irradiated and a second portion where the light is not irradiated are formed in the first resist patterns; and
　removing one of the first portion and the second portion by developing the plurality of first resist patterns to form a plurality of second resist patterns.

12. A method for manufacturing a semiconductor device according to claim 11, wherein a viscosity of the composition is at most 100 cp.

13. A method for manufacturing a semiconductor device according to claim 11, wherein an amount of the composition discharged at a time is in the range of 10 pl to 70 pl.

14. A method for manufacturing a semiconductor device according to claim 11, wherein a wavelength of the light is in the range of 350 nm to 450 nm.

15. A method for manufacturing a semiconductor device comprising the steps of:
　discharging a composition on an object at pressure in the range of $1\times10^2$ Pa to $2\times10^4$ Pa to form a plurality of first resist patterns, the composition containing a photosensitizer;
　exposing the plurality of first resist patterns with light using a photomask,wherein a first portion where the light is irradiated and a second portion where the light is not irradiated are formed in the first resist patterns; and
　removing one of the first portion and the second portion by developing the plurality of first resist patterns to form a plurality of second resist patterns.

16. A method for manufacturing a semiconductor device according to claim 15, wherein a viscosity of the composition is at most 100 cp.

17. A method for manufacturing a semiconductor device according to claim 15, wherein an amount of the composition discharged at a time is in the range of 10 pl to 70 pl.

18. A method for manufacturing a semiconductor device according to claim 15, wherein a wavelength of the light is in the range of 350 nm to 450 nm.

19. A method for manufacturing a semiconductor device comprising the steps of:
　performing ink jetting at pressure in the range of $1\times10^2$ Pa to $2\times10^4$ Pa to form a plurality of first resist patterns on an object, wherein each of the plurality of first resist patterns is made of a composition containing a photosensitizer;
　exposing the plurality of first resist patterns with light using a photomask, wherein a first portion where the light is irradiated and a second portion where the light is not irradiated are formed in the first resist patterns; and
　removing one of the first portion and the second portion by developing the plurality of first resist patterns to form a plurality of second resist patterns.

20. A method for manufacturing a semiconductor device according to claim 19, wherein a viscosity of the composition is at most 100 cp.

21. A method for manufacturing a semiconductor device according to claim 19, wherein an amount of the composition discharged at a time is in the range of 10 pl to 70 pl.

22. A method for manufacturing a semiconductor device according to claim 19, wherein a wavelength of light is in the range of 350 nm to 450 nm.

* * * * *